United States Patent
Nagashima

(10) Patent No.: US 8,792,278 B2
(45) Date of Patent: Jul. 29, 2014

(54) NON-VOLATILE MEMORY SEMICONDUCTOR STORAGE INCLUDING CONTACT PLUG

(71) Applicant: Hiroyuki Nagashima, Yokohama (JP)

(72) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 13/716,310

(22) Filed: Dec. 17, 2012

(65) Prior Publication Data

US 2013/0099348 A1 Apr. 25, 2013

Related U.S. Application Data

(63) Continuation of application No. 12/690,500, filed on Jan. 20, 2010, now Pat. No. 8,363,472.

(30) Foreign Application Priority Data

Jan. 26, 2009 (JP) .................. 2009-14413

(51) Int. Cl.
*H01L 27/10* (2006.01)
*H01L 45/00* (2006.01)
*H01L 27/04* (2006.01)
*H01L 27/24* (2006.01)
*H01L 27/06* (2006.01)
*H01L 27/02* (2006.01)

(52) U.S. Cl.
CPC ............ *H01L 27/04* (2013.01); *H01L 45/1233* (2013.01); *H01L 45/04* (2013.01); *H01L 45/146* (2013.01); *H01L 45/10* (2013.01); *H01L 45/06* (2013.01); *H01L 27/0688* (2013.01); *H01L 27/2481* (2013.01); *H01L 45/1675* (2013.01); *H01L 45/085* (2013.01); *H01L 27/0207* (2013.01)

USPC ....................................... 365/185.17

(58) Field of Classification Search
CPC ................. H01L 27/11507; H01L 27/0688; H01L 27/11578
USPC ............................. 257/314–316; 365/185.17
See application file for complete search history.

(56) References Cited

U.S. PATENT DOCUMENTS

2007/0252201 A1  11/2007  Kito et al.
2007/0297232 A1  12/2007  Iwata

FOREIGN PATENT DOCUMENTS

JP  2000-91423 A  3/2000
JP  2006-514393 A  4/2006

OTHER PUBLICATIONS

Office Action issued on Mar. 5, 2013, in Japanese patent Application No. 2009-014413 with English translation.
Office Action issued Sep. 24, 2013 in Japanese Patent Application No. 2009-014413 (with English translation).

*Primary Examiner* — Thomas L Dickey
(74) *Attorney, Agent, or Firm* — Oblon, Spivak, McClelland, Maier & Neustadt, L.L.P.

(57) ABSTRACT

A non-volatile semiconductor memory device includes: a cell array including a plurality of first wirings, a plurality of second wirings that intersects the plurality of first wirings, and memory cells that are formed at intersections of the first wirings and the second wirings and are connected between the first and second wirings; a first contact plug that comes into contact with a side portion of the first wiring provided at a first position and extends to the first wiring provided at a second position higher than the first position in a laminated direction; and a second contact plug that comes into contact with a side portion of the second wiring provided at a third position between the first position and the second position and extends to the second wiring provided at a fourth position higher than the second position in the laminated direction.

11 Claims, 31 Drawing Sheets

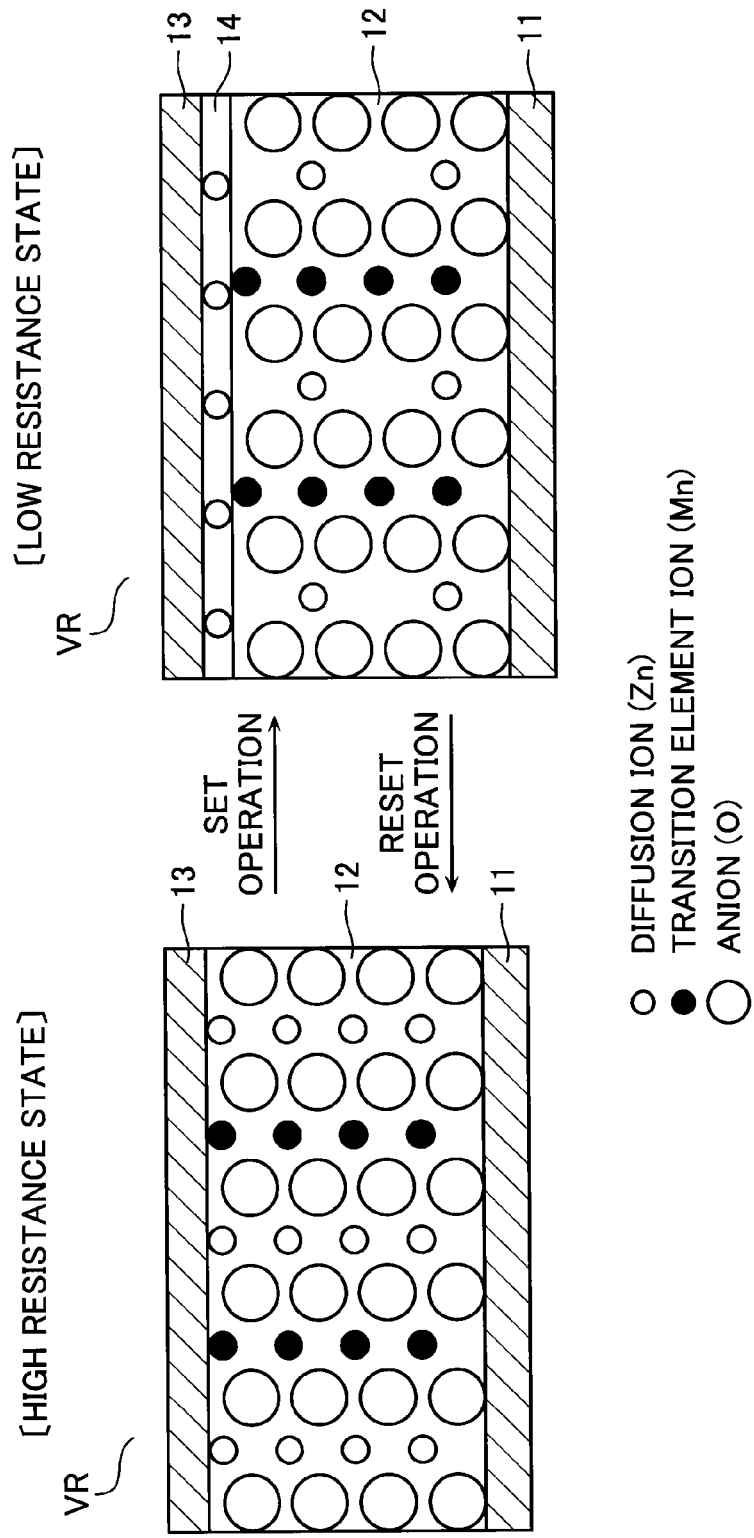

NON-VOLATILE MEMORY SEMICONDUCTOR STORAGE INCLUDING CONTACT PLUG

CROSS-REFERENCE TO RELATED APPLICATIONS

This application is a continuation of and claims the benefit of priority under 35 U.S.C. §120 from U.S. Ser. No. 12/690,500 filed Jan. 20, 2010, and claims the benefit of priority under 35 U.S.C. §119 from Japanese Patent Application No. 2009-14413 filed Jan. 26, 2009, the entire contents of each of which are incorporated herein by reference.

BACKGROUND OF THE INVENTION

1. Field of the Invention

The present invention relates to a multi-layer non-volatile semiconductor memory device including a laminate of cross-point memory cells and a method of manufacturing the same.

2. Description of the Related Art

As an electrically rewritable non-volatile memory, a flash memory has been known in which memory cells having a floating gate structure are connected in a NAND connection manner or a NOR connection manner to form a memory cell array. In addition, a ferroelectric memory has been known as a non-volatile and high-speed random access memory.

As a technique for reducing the size of the memory cell, a resistance-change memory has been proposed in which a variable resistive element is used in the memory cell. Examples of the variable resistive element include a phase-change memory element whose resistance is changed due to a variation in the crystal/amorphous state of a chalcogenide compound, an MRAM element whose resistance is changed by a tunneling magnetoresistive effect, a polymeric ferroelectric RAM (PFRAM) element in which a resistive element is made of a conductive polymer, and a ReRAM element whose resistance is changed by the application of an electric pulse (see Japanese Patent Application Laid-Open No. 2006-344349, paragraph 0021).

The resistance-change memory may be replaced with a transistor and a memory cell may include a series circuit of a Schottky diode and a resistance-change element. Therefore, it is easy to laminate the elements and it is possible to obtain a three-dimensional structure. As a result, it is possible to further improve the degree of integration (see Japanese Patent Application Laid-Open No. 2005-522045).

In the resistance-change memory, similar to the memory according to the related art, it is preferable to further simplify a manufacturing process and reduce manufacturing costs.

SUMMARY OF THE INVENTION

According to one aspect of the present invention, there is provided a non-volatile semiconductor memory device including: a cell array including a plurality of first wirings, a plurality of second wirings that intersects the plurality of first wirings, and memory cells that are formed at intersections of the first wirings and the second wirings and are connected between the first and second wirings; a first contact plug that comes into contact with a side portion of the first wiring provided at a first position and extends to the first wiring provided at a second position higher than the first position in a laminated direction; and a second contact plug that comes into contact with a side portion of the second wiring provided at a third position between the first position and the second position and extends to the second wiring provided at a fourth position higher than the second position in the laminated direction.

According to another aspect of the present invention, there is provided a non-volatile semiconductor memory device including: a cell array including a plurality of first wirings, a plurality of second wirings that intersects the plurality of first wirings, and memory cells that are formed at intersections of the first wirings and the second wirings and are connected between the first and second wirings; a first contact plug that comes into contact with a side portion of the first wiring provided at a first position and extends in a laminated direction to a layer on which the second wiring provided at a second position higher than the first position is formed; and a second contact plug that comes into contact with a side portion of the second wiring provided at a third position between the first position and the second position and extends in the laminated direction to a layer on which the second wiring provided at the second position is formed; and a third contact plug that comes into contact with a side portion of the first wiring provided at a fourth position between the third position and the second position and extends in the laminated direction to a layer on which the second wiring provided at the second position is formed.

According to still another aspect of the present invention, there is provided a method of manufacturing a non-volatile semiconductor memory device including a cell array having a plurality of first wirings, a plurality of second wirings that intersects the plurality of first wirings, and memory cells that are formed at intersections of the first wirings and the second wirings and are connected between the first and second wirings, the method including: sequentially laminating a layer forming the first wiring and a layer forming the memory cells to form a first laminated structure; etching the first laminated structure in a strip shape extending in a first direction; sequentially laminating a layer forming the second wiring and a layer forming the memory cells on the first laminated structure to form a second laminated structure; etching the first laminated structure and the second laminated structure except for the first wiring in a strip shape extending in a second direction intersecting the first direction; forming a first contact plug that comes into contact with a side portion of the first wiring included in the first laminated structure and extends to an upper surface of the second laminated structure in a laminated direction; sequentially laminating a layer forming the first wiring and a layer forming the memory cells on the second laminated structure to form a third laminated structure; etching the second laminated structure and the third laminated structure except for the second wiring in a strip shape extending in the first direction; and forming a second contact plug that comes into contact with a side portion of the second wiring included in the second laminated structure and extends to an upper surface of the third laminated structure in the laminated direction.

BRIEF DESCRIPTION OF THE DRAWINGS

FIG. 4A is a cross-sectional view schematically illustrating an example of a ReRAM (variable resistive element VR) according to the first embodiment;

DETAILED DESCRIPTION OF THE EMBODIMENTS

Hereinafter, embodiments of the invention will be described with reference to the accompanying drawings.

[First Embodiment]

(Schematic Structure of Non-volatile Semiconductor Memory Device According to First Embodiment)

Figure 1:
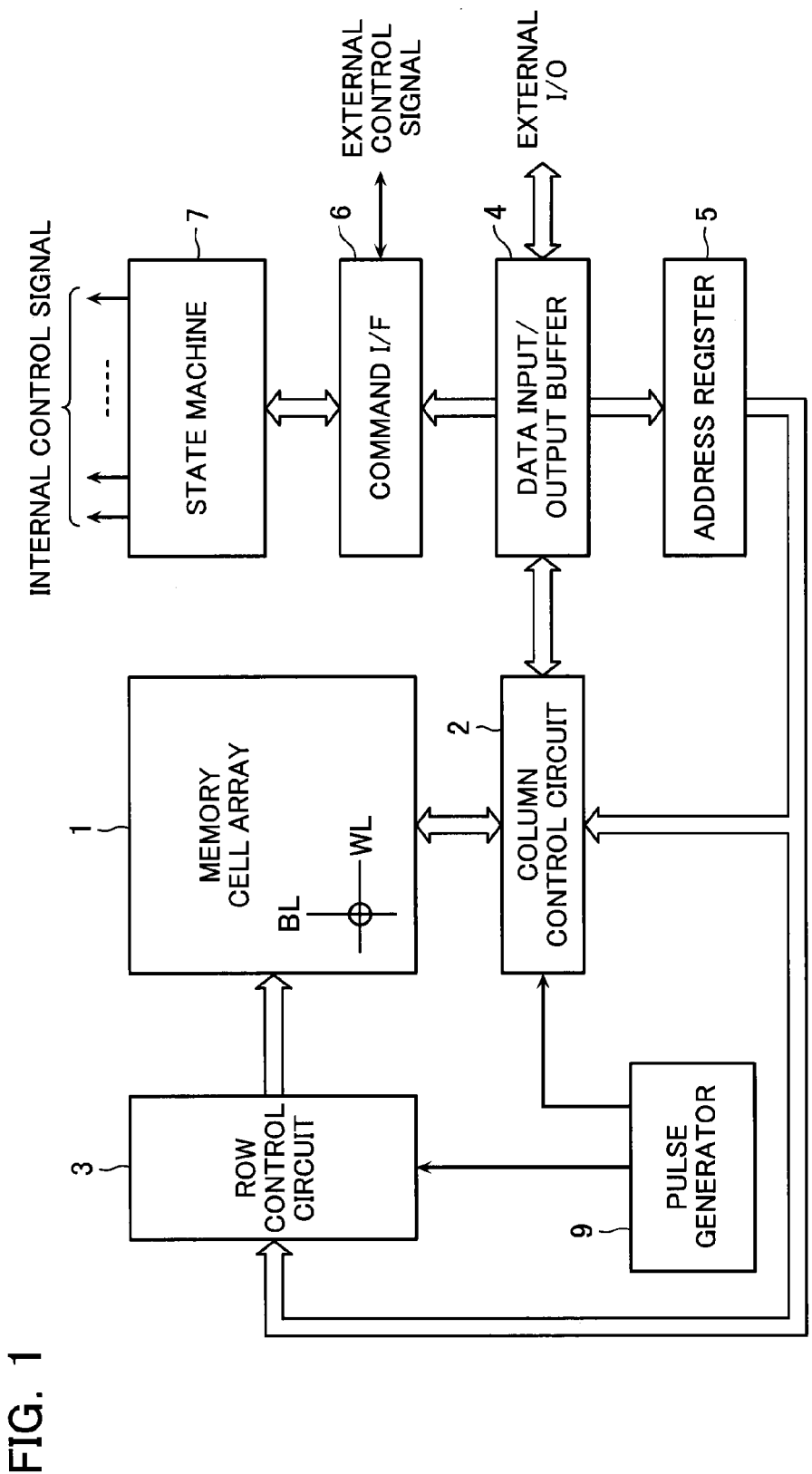
FIG. 1 is a block diagram illustrating a non-volatile semiconductor memory device according to a first embodiment of the invention.

First, the schematic structure of a non-volatile semiconductor memory device according to a first embodiment of the invention will be described with reference to FIGS. 1 to 4. FIG. 1 is a block diagram illustrating the non-volatile semiconductor memory device (non-volatile memory) according to the first embodiment.

The non-volatile semiconductor memory device according to the first embodiment includes a memory cell array 1 having memory cells arranged in a matrix. The memory cells are configured by ReRAMs (variable resistive elements), which will be described below. A column control circuit 2 is provided adjacent to the memory cell array 1 in the direction of the bit line BL. The column control circuit 2 controls bit lines BL of the memory cell array 1, erases data in the memory cells, writes data to the memory cells, and reads data from the memory cells. In addition, a row control circuit 3 is provided adjacent to the memory cell array 1 in the direction of the word line WL. The row control circuit 3 applies a voltage required to select a word line WL of the memory cell array 1, erase data in the memory cells, write data to the memory cells, and read data from the memory cells A data input/output buffer 4 is connected to an external host (not shown) through an I/O line, receives write data, an erase command, address data, and command data, and outputs read data. The data input/output buffer 4 transmits the received write data to the column control circuit 2, receives read data from the column control circuit 2, and outputs the received data to the outside. An address supplied from the outside to the data input/output buffer 4 is transmitted to the column control circuit 2 and the row control circuit 3 through an address register 5. A command supplied from the host to the data input/output buffer 4 is transmitted to a command interface 6. The command interface 6 receives an external control signal from the host and determines whether data input to the data input/output buffer 4 is write data, a command, or an address. If it is determined that the input data is a command, the command interface 6 transmits the received data as a command signal to a state machine 7. The state machine 7 is for managing the entire non-volatile memory. The state machine 7 receives a command from the host and manages a read operation, a write operation, an erase operation, and a data input/output operation. The external host may receive status information managed by the state machine 7 and determine the result of an operation. The status information is also used to control the write and erase operations.

A pulse generator 9 is controlled by the state machine 7. Under the control of the state machine 7, the pulse generator 9 may output a pulse with an arbitrary voltage at arbitrary timing. The generated pulse may be transmitted to an arbitrary wiring selected by the column control circuit 2 and the row control circuit 3.

Peripheral circuit elements other than the memory cell array 1 may be formed on an Si substrate that is provided immediately below the memory cell array 1 formed on a wiring layer. In this way, the area of the non-volatile memory chip may be substantially equal to that of the memory cell array 1.

Figure 2A:
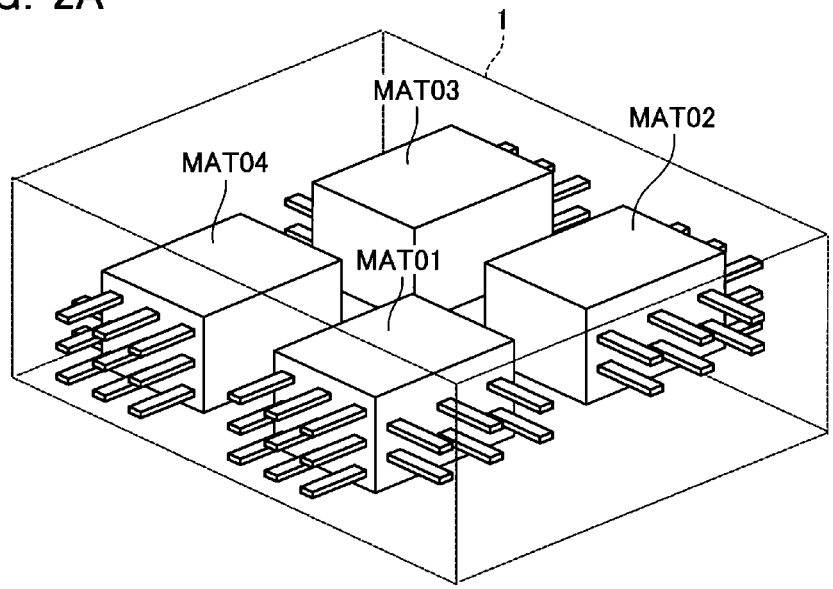
FIG. 2A is a perspective view illustrating a memory cell array 1 (unit cell arrays MAT00 to MAT04) of the non-volatile semiconductor memory device according to the first embodiment.
Figure 2B:
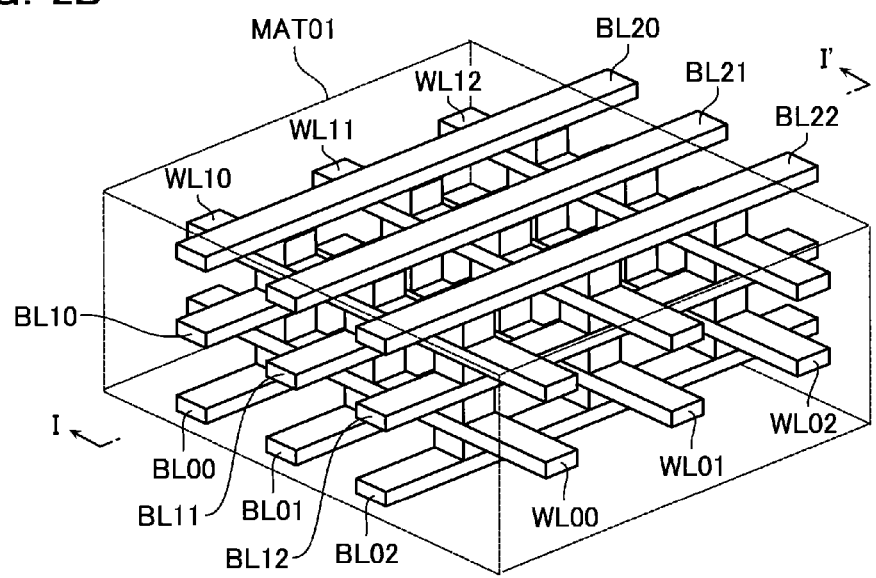
FIG. 2B is an enlarged perspective view illustrating a portion of the memory cell array 1 shown in FIG. 2A (a perspective view illustrating the unit cell array MAT01)
Figure 3A:
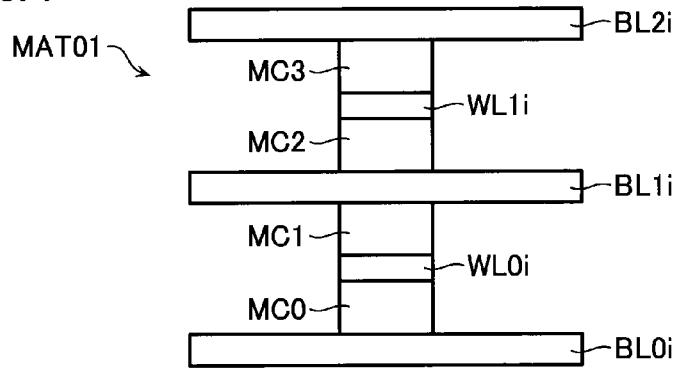
FIG. 3A is a cross-sectional view taken along the line I-I' of FIG. 2B, as viewed from the direction of an arrow.

FIG. 2A is a perspective view illustrating the memory cell array 1. FIG. 2B is an enlarged perspective view illustrating a portion of the memory cell array 1. FIG. 3A is a cross-sectional view illustrating one memory cell taken along the line I-I' of FIG. 2B, as viewed from the direction of an arrow.

As shown in FIG. 2A, the memory cell array 1 includes four divided unit cell arrays MAT01 to MAT04. Each of the unit cell arrays MAT01 to MAT04 forms a portion of the memory cell array 1. The unit cell arrays MAT01 to MAT04 are two-dimensionally arranged, as shown in FIG. 2A. The structure shown in FIG. 2A is just an illustrative example, and the memory cell array 1 may include four or more unit cell arrays. The memory cell array 1 may include unit cell arrays that are three-dimensionally laminated.

As shown in FIG. 2B, the unit cell array MAT01 includes a plurality of bit lines BL0$i$ (i=0 to 2), a plurality of word lines WL0$i$, a plurality of bit lines BL1$i$, a plurality of word lines WL1$i$, and a plurality of bit lines BL2$i$ from the lower side to the upper side. The bit lines BL0$i$ to BL2$i$ are formed so as to extend in the same direction (column direction). The word lines WL0$i$ and WL1$i$ are formed so as to extend in a direction (row direction) orthogonal to (intersecting) the bit lines BL0$i$ to BL2$i$.

As shown in FIG. 3A, memory cells MC0 to MC3 are formed at intersections of the word lines WL0$i$ and WL1$i$ and the bit lines BL0$i$ to BL2$i$. That is, the word line WL0$i$ is shared by the memory cells MC0 and MC1 provided below and above the word line WL0$i$. The bit line BL1$i$ is shared by the memory cells MC1 and MC2 provided below and above the bit line BL1$i$. The word line WL1$i$ is shared by the memory cells MC2 and MC3 provided below and above the word line WL1$i$.

Figure 3B:
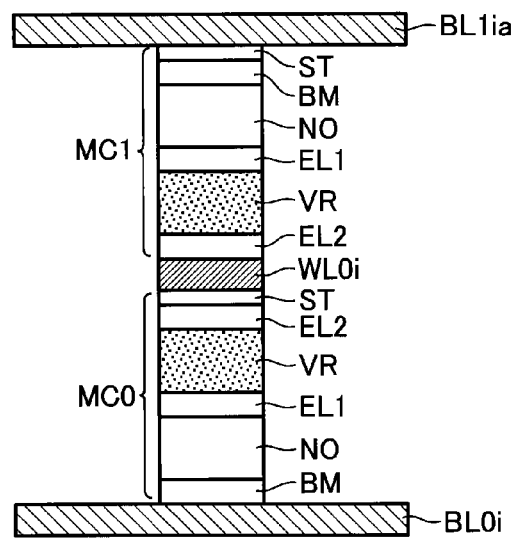
FIG. 3B is an enlarged cross-sectional view illustrating memory cells MC0 and MC1.

As shown in FIG. 3B, each of the memory cells MC1 and MC0 is a series circuit of a variable resistive element VR and a non-ohmic element NO. FIG. 3B shows the memory cells MC0 and MC1.

As shown in FIG. 3B, the memory cell MC0 includes a barrier metal BM, a non-ohmic element NO, an electrode EL1, a variable resistive element VR, an electrode EL2, and a stopper ST laminated in this order from the bit line BL0$i$ to the word line WL0$i$. The memory cell MC1 includes an electrode EL2, a variable resistive element VR, an electrode EL1, a non-ohmic element NO, a barrier metal BM, and a stopper ST laminated in this order from the word line WL0$i$ to the bit line BL1$i$. The memory cell MC2 has the same structure as the memory cell MC0, and the memory cell MC3 has the same structure as the memory cell MC2.

When a voltage is applied to the variable resistive element VR, the resistance value thereof is changed by a current, heat, or chemical energy. Therefore, the electrodes EL1 and EL2 respectively serving as a barrier metal and an adhesive layer are arranged on both sides of the variable resistive element VR in the vertical direction. The electrode is made of, for example, Pt, Au, Ag, TiAlN, SrRuO, Ru, RuN, Ir, Co, Ti, TiN, TaN, LaNiO, Al, PtIrOx, PtRhOx, or Rh/TaAlN. In addition, a metal film for uniform alignment may be inserted. For example, a separate buffer layer, a barrier metal layer, and an adhesive layer may be additionally inserted.

As the variable resistive element VR, any of the following may be used: a variable resistive element whose resistance is changed by phase transition between a crystal state and a noncrystalline state, such as chalcogenide (PCRAM); a variable resistive element that is formed by cross-linking (contacting bridge) electrodes by the precipitation of metal cations or by ionizing the precipitated metal to break the crosslink between the electrodes, thereby changing the resistance value (CBRAM); and a variable resistive element whose resistance is changed by a voltage or a current applied (ReRAM) (the variable resistive elements are mainly classified into a variable resistive element whose resistance is changed depending on whether there is a charge trapped in a charge trap that exists on an electrode interface and a variable resistive element whose resistance is changed depending on whether there is a transmission path caused by, for example, an oxygen defect).

FIG. 4A shows an example of the ReRAM. In the variable resistive element VR shown in FIG. 4A, a recording layer 12 is provided between electrode layers 11 and 13. The recording layer 12 is made of a composite compound including at least two kinds of cation elements. At least one kind of cation element is a transition element having the d-orbit that is incompletely filled with electrons and the shortest distance between adjacent cation elements is equal to or less than 0.32 nm. Specifically, at least one kind of cation element is represented by a chemical formula $A_xM_yX_z$ (A and M are different elements) and has a crystal structure, such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), or a perovskite structure ($AMO_3$).

In FIG. 4A, A is Zn, M is Mn, and X is O. In the recording layer 12, a small white circle indicates a diffusion ion (Zn), a large white circle indicates an anion (O), and a small black circle indicates a transition element ion (Mn). The initial state of the recording layer 12 is a high resistance state. However, when a fixed potential is applied to the electrode layer 11 and a negative voltage is applied to the electrode layer 13, some of the diffusion ions in the recording layer 12 are moved to the electrode layer 13 and the number of diffusion ions in the recording layer 12 becomes relatively smaller than the number of anions. The diffusion ions moved to the electrode layer 13 receive electrons from the electrode layer 13 and are precipitated as metal, thereby forming a metal layer 14. In the recording layer 12, the number of anions is excessively large, which results in an increase in the valence of transition element ions in the recording layer 12. In this way, the recording layer 12 has electron conductivity by the implantation of carriers and a set operation is completed. For reproduction, the recording layer 12 may be made of a material through which a sufficiently small amount of current not to change the resistance of the material flows. In order to set a program state (low resistance state) as the initial state (high resistance state), for example, a sufficiently large amount of current may flow through the recording layer 12 for a sufficient amount of time to perform Joule heating, thereby accelerating the oxidation-reduction reaction of the recording layer 12. In addition, during the set operation, the electric field may be applied in the opposite direction in order to perform a reset operation.

It is preferable that the bit lines BL0i to BL2i and the word lines WL0i and WL1i be made of a material that is resistant to heat and has a low resistance value. For example, the bit lines and the word lines may be made of W, WSi, NiSi, or CoSi.

Figure 4B:
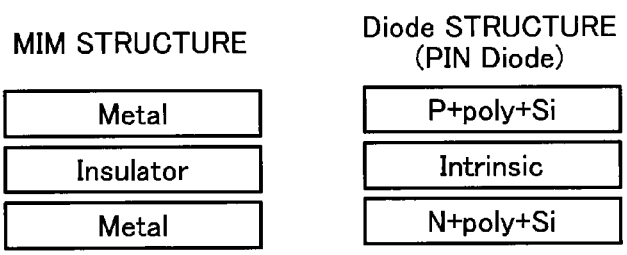
FIG. 4B is a diagram illustrating a specific example of an ohmic element NO according to the first embodiment.

As shown in FIG. 4B, the non-ohmic element NO has, for example, (a) a MIM (metal-insulator-metal) structure and (b) a PIN structure (P+ polysilicon-intrinsic-N+ polysilicon). In this case, the electrodes EL2 and EL3 forming a barrier metal layer and an adhesive layer may be inserted into the structure. When the MIM structure is used, a bipolar operation may be performed. When the PIN structure (diode structure) is used, a unipolar operation may be performed in terms of the characteristics of the structure.

The stopper ST is made of tungsten (W). The electrodes EL1 and EL2 and the barrier metal BM are made of titanium (Ti)/titanium nitride (TiN).

(Detailed Shapes of Bit Lines BL0i to BL2i and Word Lines WL0i and WL1i)

Next, the detailed shapes of the bit lines BL0i to BL2i and the word lines WL0i and WL1i will be described with reference to FIGS. 5 and 6.

Figure 5:
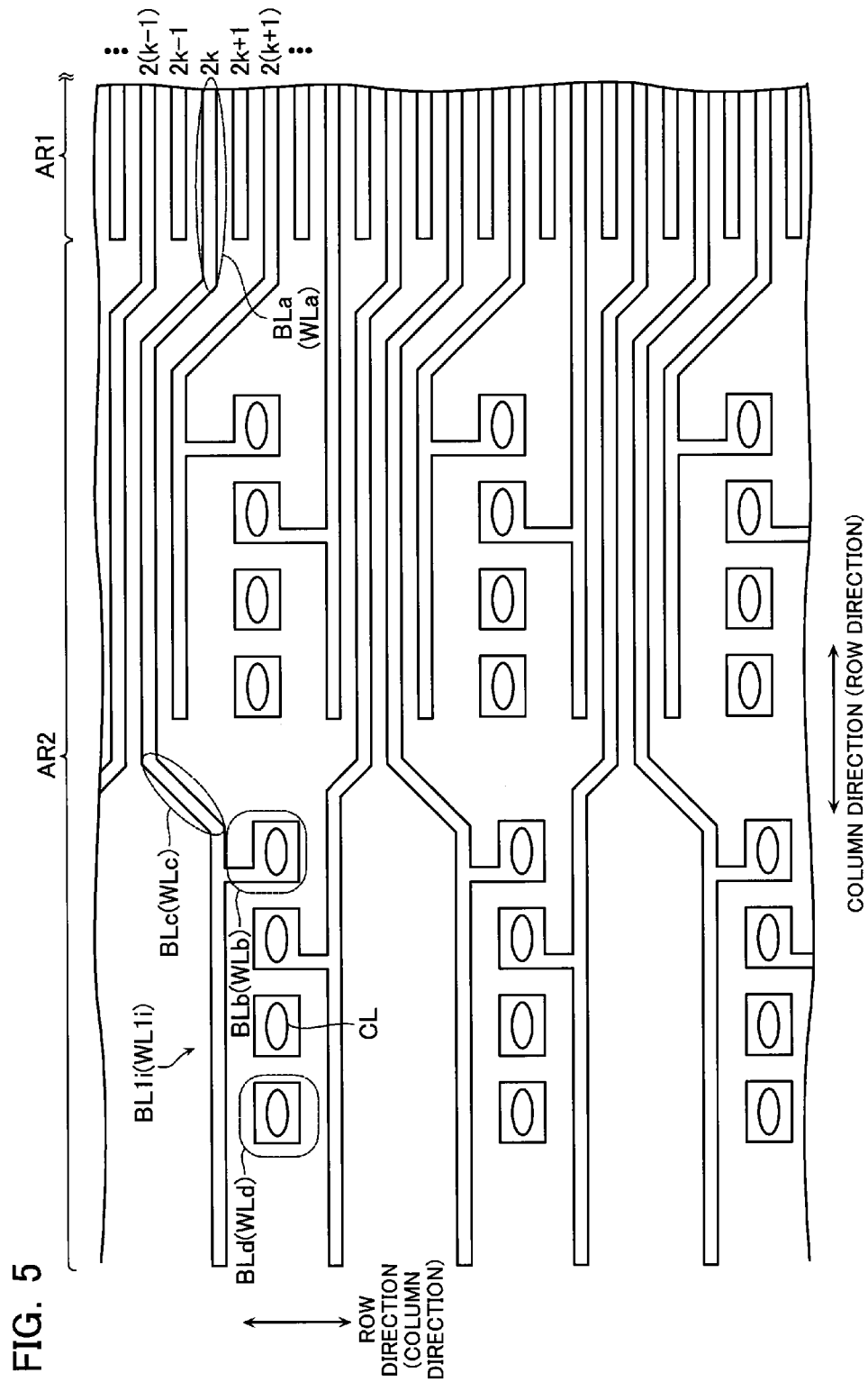
FIG. 5 is a top view illustrating a bit line BL1$i$ according to the first embodiment.

FIG. 5 is a top view illustrating the bit line BL1i. The word line WL1i has the same basic pattern as the bit line except that it extends in a direction orthogonal to the direction in which the bit line extends. Therefore, the reference numeral of the word line is represented in parentheses '( )' for reference.

As shown in FIG. 5, the bit line BL1i is formed across a memory cell area AR1 and a peripheral area AR2. The memory cell MC is provided in the memory cell area AR1. In the peripheral area AR2, contact plugs CL (CL1 to CL8) extend in a laminated direction so as to be adjacent to the bit lines BL1i to BL3i and the word lines WL1i and WL2i formed on each layer. In FIG. 5, the peripheral area AR2 is provided on only one side of the memory cell area AR1. However, actually, the peripheral areas AR2 are provided on both sides of the memory cell area AR1.

As shown in FIG. 5, in the memory cell area AR1, the bit line BL1i includes a first straight portion BLa. The first straight portion BLa extends in parallel to the column direction, and is arranged at a first pitch in a row direction (a direction orthogonal to the column direction). In the memory cell area AR1, the word line WL1i and the word line WL0i are provided above and below the bit line BL1i so as to extend in a direction orthogonal to the direction in which the bit line extends. The memory cells MC2 and MC1 are formed at the intersections of the word lines and the bit lines.

As shown in FIG. 5, in the peripheral area AR2 arranged on one side, a 2n-th (n is a positive integer) bit line BL1i from a predetermined position in the row direction has a contact connection portion BLb at one end thereof in the column direction. Although not shown in the drawings, in the peripheral area AR2 arranged on the other side, a (2n+1)-th bit line BL1i from a predetermined position in the row direction has a contact connection portion BLb at the other end thereof in the column direction. A 2m-th (m is an integer except for an integer multiple of 4) bit line BL1i from a predetermined position in the row direction has a second straight portion BLc that extends in a direction inclined at an angle of 45° with respect to the column direction. The bit line BL1i further includes an island-shaped portion BLd that is adjacent to the contact connection portion BLb in the row direction.

The contact connection portion BLb is formed such that the upper and lower surfaces thereof come into contact with the contact plug CL (an elliptical shape as viewed from the upper side) that extends in the laminated direction. The width of the contact connection portion BLb is more than that of the first straight portion BLa in the row direction. The second straight portion BLc is provided so as not to contact adjacent wirings. The contact connection portion BLb and the second straight portion BLc are formed integrally with the first straight portion BLa. The island-shaped portion BLd is provided so as to be separated from the first straight portion BLa and the contact connection portion BLb. The island-shaped portion BLd is formed such that the upper and lower surfaces thereof come into contact with the contact plug CL.

As shown in FIG. 5, the word line WL1i is formed across the memory cell area AR1 and the peripheral area AR2. Similar to the bit line BL1i, the word line WL1i includes a first straight portion WLa, a contact connection portion WLb, a second straight portion WLc, and an island-shaped portion WLd. The structure of the word line WL1i is substantially the same as that of the bit line BL1i, and thus a description thereof will be omitted.

Figure 6:
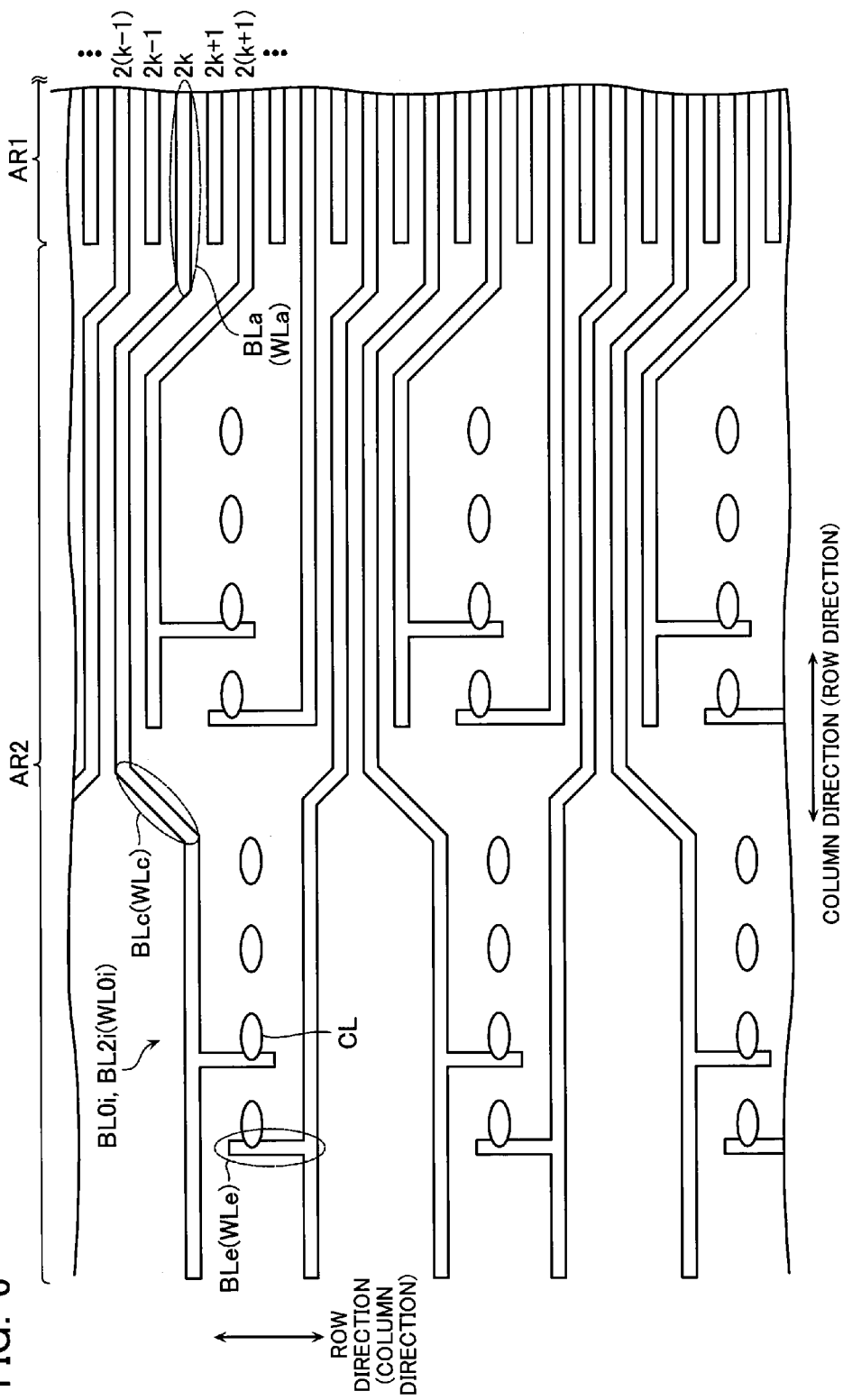
FIG. 6 is a top view illustrating bit lines BL0$i$ and BL2$i$ according to the first embodiment.

FIG. 6 is a top view illustrating the bit lines BL0i and BL2i. The word line WL0i has the same basic pattern as the bit line except that it extends in a direction orthogonal to the direction in which the bit line extends. Therefore, the reference numeral of the word line is represented in parentheses '( )' for reference.

As shown in FIG. 6, the bit line BL0i, BL2i are formed across the memory cell area AR1 and the peripheral area AR2.

As shown in FIG. 6, in the memory cell area AR1, the bit lines BL0i and BL2i each have a first straight portion BLa. The first straight portion BLa extends in parallel to the column direction, and is arranged at a first pitch in the row direction. In the memory cell area AR1, the word line WL0i (WL1i) is provided above (below) the bit line BL0i (BL2i) so as to extend in a direction orthogonal to the direction in which the bit line extends. The memory cells MC0 and MC3 are formed at the intersections of the word line and the bit lines.

As shown in FIG. 6, in the peripheral area AR2, 2n-th (n is a positive integer) bit lines BL0i and BL2i from a predetermined position in the row direction each have a contact connection portion BLe at one end thereof in the column direction. In addition, 2m-th (m is an integer except for an integer multiple of 4) bit lines BL0i and BL2i from a predetermined position in the row direction each have a second straight portion BLc that extends in a direction inclined at an angle of 45° with respect to the column direction.

A contact connection portion BLe is formed such that the upper and side surfaces thereof come into contact with the contact plug CL extending in the laminated direction. The width of the contact connection portion BLe is smaller than that of the contact connection portion BLb in the column direction. The contact connection portion BLe and the second straight portion BLc are formed integrally with the first straight portion BLa.

As shown in FIG. 6, the word line WL0i is formed across the memory cell area AR1 and the peripheral area AR2. Similar to the bit lines BL0i and BL2i, the word line WL0i includes a first straight portion WLa, a contact connection portion WLe, and a second straight portion WLc. The structure of the word line WL0i is substantially the same as those of the bit lines BL0i and BL2i and thus a description thereof will be omitted.

(Structure of Contact Plugs CL1 to CL8)

Figure 7:
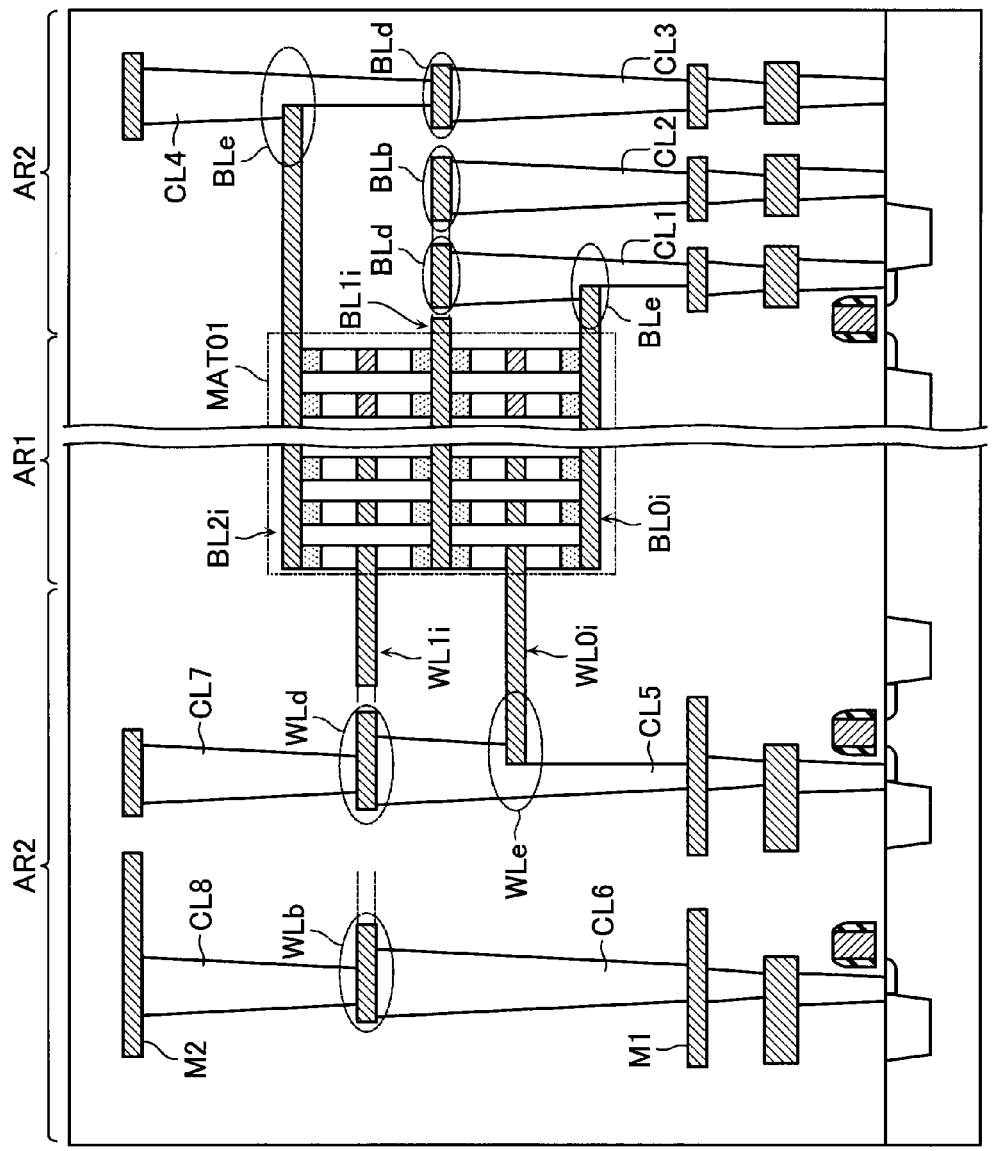
FIG. 7 is a diagram schematically illustrating the connection of contact plugs CL1 to CL8 according to the first embodiment.
Figure 8:
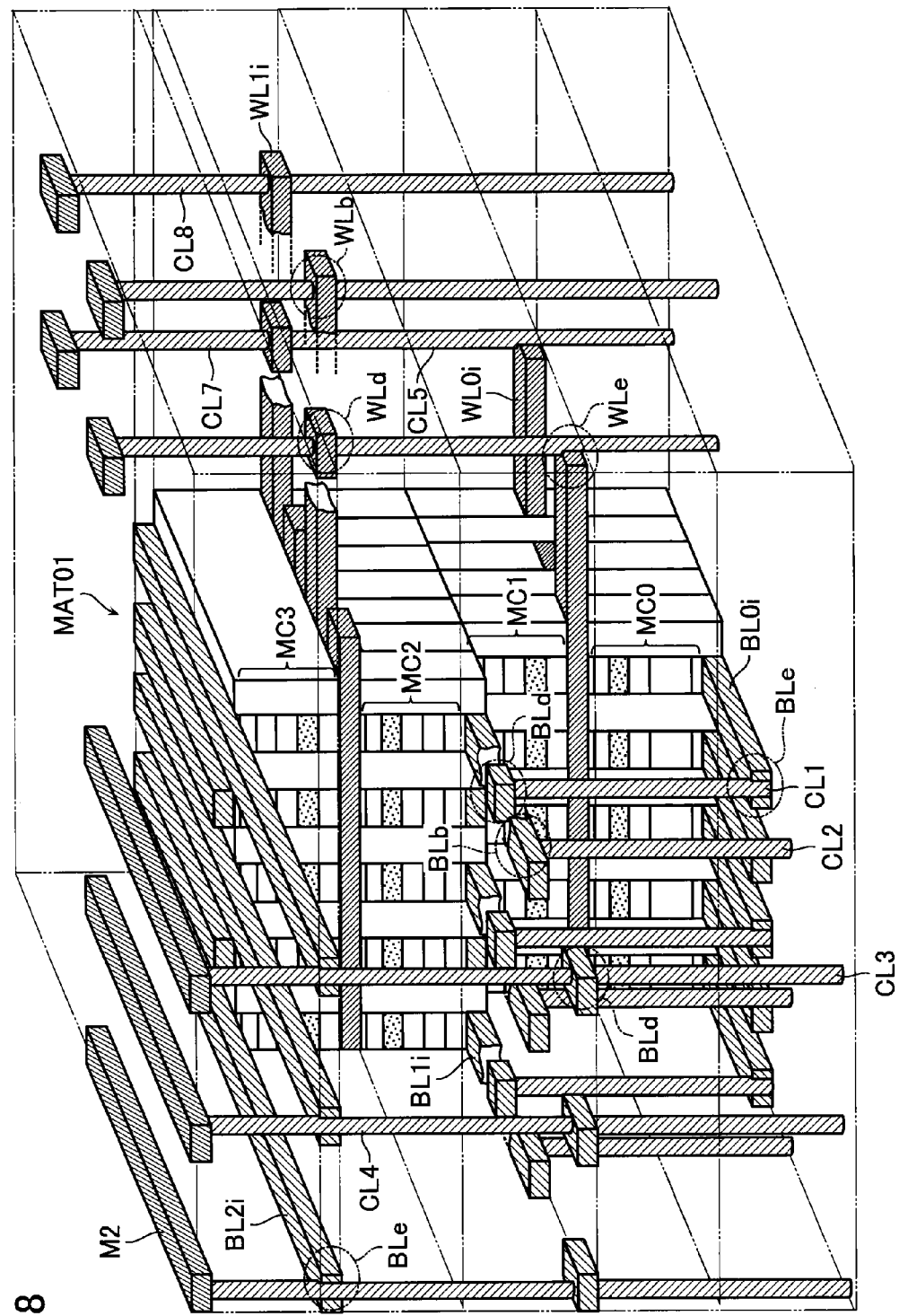
FIG. 8 is a perspective view illustrating the connection of the contact plugs CL1 to CL8 according to the first embodiment.
Figure 9:
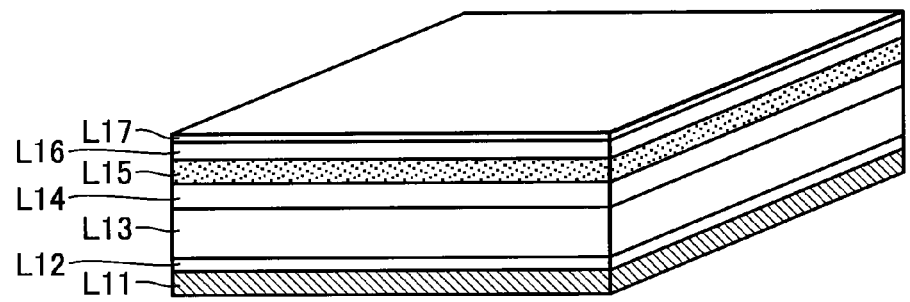
FIG. 9 is a perspective view illustrating a process of manufacturing the non-volatile semiconductor memory device according to the first embodiment.

Next, the structure of the contact plugs CL1 to CL8 will be described with reference to FIGS. 7 and 8. FIG. 7 is a diagram schematically illustrating the structure of the contact plugs CL1 to CL8. FIG. 8 is a perspective view illustrating the structure of the contact plugs CL1 to CL8.

As shown in FIGS. 7 and 8, the non-volatile semiconductor memory device according to the first embodiment includes the memory cell area AR1 and the peripheral area AR2.

The unit cell array MAT01 is provided in the memory cell area AR1. FIGS. 7 and 8 show the detailed structure of only the unit cell array MAT01. However, in the non-volatile semiconductor memory device according to this embodiment, the unit cell arrays MAT02 to MAT04 have the same structure as the unit cell array MAT01.

As described above, the word lines WL0i and WL1i and the bit lines BL0i to BL2i (i=0 to 2) extending from the memory cell area AR1 are provided in the peripheral area AR2. In addition, the contact plugs CL1 to CL8, an upper wiring M2, and a lower wiring M1 are provided in the peripheral area AR2. In FIG. 8, the lower wiring M1 is omitted.

As shown in FIG. 7, the upper wiring M2 is provided above the unit cell array MAT01. The lower wiring M1 is provided below the unit cell array MAT01.

The contact plugs CL1 to CL3 are formed so as to extend in the laminated direction from the upper surface of the lower wiring M1 to the lower surface of the bit line BL1i. The contact plug CL1 is formed so as to come into contact with the upper surface and a side portion of the contact connection portion BLe of the bit line BL0i. The contact plug CL1 is formed so as to come into contact with the lower surface of the island-shaped portion BLd of the bit line BL1i. The contact plug CL2 is formed so as to come into contact with the lower surface of the contact connection portion BLb of the bit line BL1i. The contact plug CL3 is formed so as to come into contact with the lower surface of the island-shaped portion BLd of the bit line BL1i.

The contact plug CL4 is formed so as to extend in the laminated direction from the upper surface of the island-shaped portion BLd of the bit line BL1i to the lower surface of the upper wiring M2. The contact plug CL4 is formed so as to come into contact with the island-shaped portion BLd of the bit line BL1i and the upper wiring M2. The contact plug CL4 is formed so as to come into contact with the upper surface and a side portion of the contact connection portion BLe of the bit line BL2i.

The contact plugs CL5 and CL6 are formed so as to extend in the laminated direction from the upper surface of the lower wiring M1 to the lower surface of the word line WL1i. The contact plug CL5 is formed so as to come into contact with the upper surface and a side portion of the contact connection portion WLe of the word line WL0i. In addition, the contact plug CL5 is formed so as to come into contact with the lower surface of the island-shaped portion WLd of the word line WL1i. The contact plug CL6 is formed so as to come into contact with the contact connection portion WLb of the word line WL1i.

The contact plug CL7 is formed so as to extend in the laminated direction from the upper surface of the island-shaped portion WLd of the word line WL1i to the lower surface of the upper wiring M2. The contact plug CL7 is formed so as to come into contact with the island-shaped portion WLd of the word line WL1i and the upper wiring M2.

The contact plug CL8 is formed so as to extend in the laminated direction from the upper surface of the contact connection portion WLb of the word line WL1i to the lower surface of the upper wiring M2. In addition, the contact plug CL8 is formed so as to come into contact with the contact connection portion WLb of the word line WL1i and the upper wiring M2.

The structure of the contact plugs CL1 to CL8 may be described in other words as follows. That is, the contact plugs CL1 to CL3 (first contact plugs) are formed so as to come into contact with the upper surface and a side portion of the bit line BL0i (first wiring) provided at a first position and to extend in the laminated direction to the bit line BL1i (first wiring) that is provided at a second position higher than the first position. The contact plugs CL5 and CL6 (second contact plugs) are formed so as to come into contact with the upper surface and a side portion of the word line WL0i that is provided at a third position between the first position and the second position and to extend in the laminated direction to the word line WL1i that is provided at a fourth position higher than the second position.

The contact plug CL4 (third contact plug) is formed so as to come into contact with the upper surface and a side portion of the bit line BL2i that is provided at a fifth position below the upper wiring M2 and to extend in the laminated direction from the bit line BL1i provided at a sixth position lower than the fifth position to the upper wiring M2. The contact plugs CL7 and CL8 (fourth contact plugs) are formed so as to extend in the laminated direction from the word line WL1i provided at a seventh position between the fifth position and the sixth position to the upper wiring M2.

The contact plug CL1 (fifth contact plug) is formed so as to come into contact with the upper surface and a side portion of the bit line BL0i that is provided at an eighth position above the lower wiring M1 and to extend in the laminated direction from the lower wiring M1 to the bit line BL1i disposed at a ninth position higher than the eighth position. The contact plug CL5 (sixth contact plug) is formed so as to come into contact with the upper surface and a side portion of the word line WL0i that is provided at a tenth position between the eighth position and the ninth position and to extend in the laminated direction to the word line WL1i that is provided at an eleventh position higher than the ninth position.

(Method of Manufacturing Non-Volatile Semiconductor Memory Device According to First Embodiment)

Next, a method of manufacturing the non-volatile semiconductor memory device according to the first embodiment will be described. A process of forming the unit cell array MAT01 will be described. The unit cell arrays MAT02 to MAT04 are manufactured by the same process as that used to form the unit cell array MAT01.

First, an FEOL (front end of line) process is performed to form, for example, a transistor (lower wiring M1) of a necessary peripheral circuit on a silicon substrate (not shown), and an interlayer insulating layer is deposited on the substrate.

Then, the layers above the word line WL0i are formed on the interlayer insulating layer.

FIGS. 9 to 24 are perspective views illustrating a process of forming the layers above the word line WL0i in order of process. The process of forming the layers above the word line will be described appropriately with reference to FIGS. 9 to 24.

When the interlayer insulating layer is formed as described above, as shown in FIG. 9, layers L11 to L17 are sequentially deposited on the interlayer insulating layer. The layers L11 to L17 will become the bit line BL0i, the barrier metal BM, the non-ohmic element NO, the electrode EL1, the variable resistive element VR, the electrode EL2, and the stopper ST later.

Figure 10:
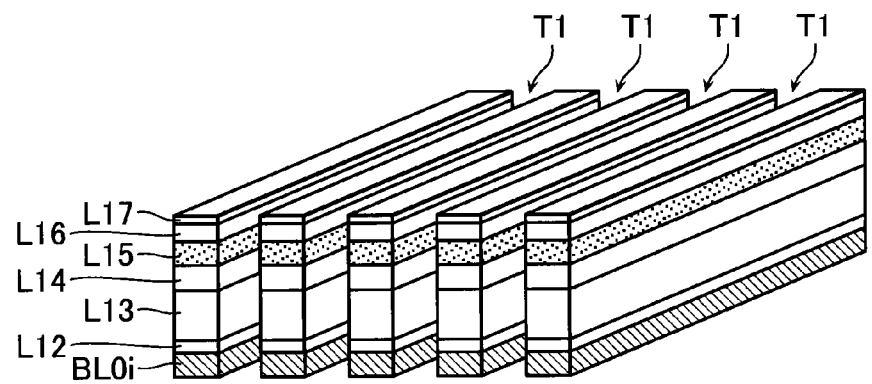
FIG. 10 is a perspective view illustrating the process of manufacturing the non-volatile semiconductor memory device according to the first embodiment.

Then, a hard mask (not shown), such as TEOS, is formed on the upper surface of the laminated structure and first anisotropic etching is performed using the mask. In this way, as shown in FIG. 10, grooves T1 are formed through the layers L11 to L17 at a predetermined pitch so as to extend in the column direction. The layer L11 becomes the bit line BL0i.

Figure 11:
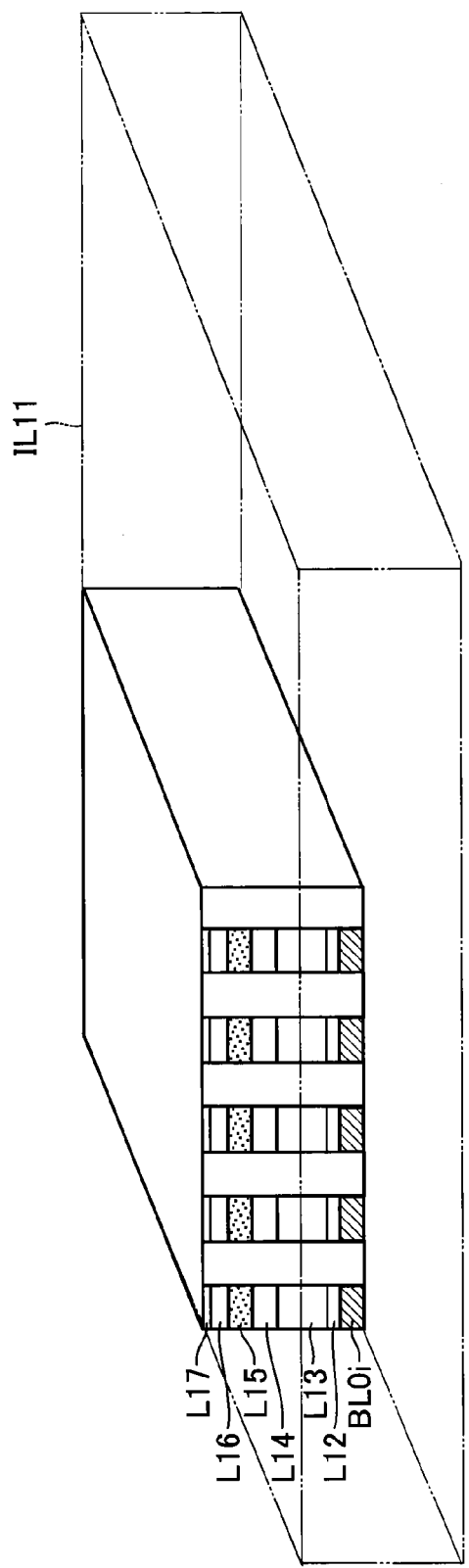
FIG. 11 is a perspective view illustrating the process of manufacturing the non-volatile semiconductor memory device according to the first embodiment.

Then, the grooves T1 are filled up with an interlayer insulating layer IL11. It is preferable that the interlayer insulating layer IL11 be made of a material with a high insulating performance, low capacitance, and good filling characteristics. Then, a planarizing process, such as CMP, is performed to remove the remaining interlayer insulating layer IL11 and expose the layer L17. The layer L17 (to be stopper ST later) has a function of stopping the planarizing process, such as CMP, at a predetermined position in the laminated direction. FIG. 11 is a cross-sectional view after the planarizing process.

Figure 12:
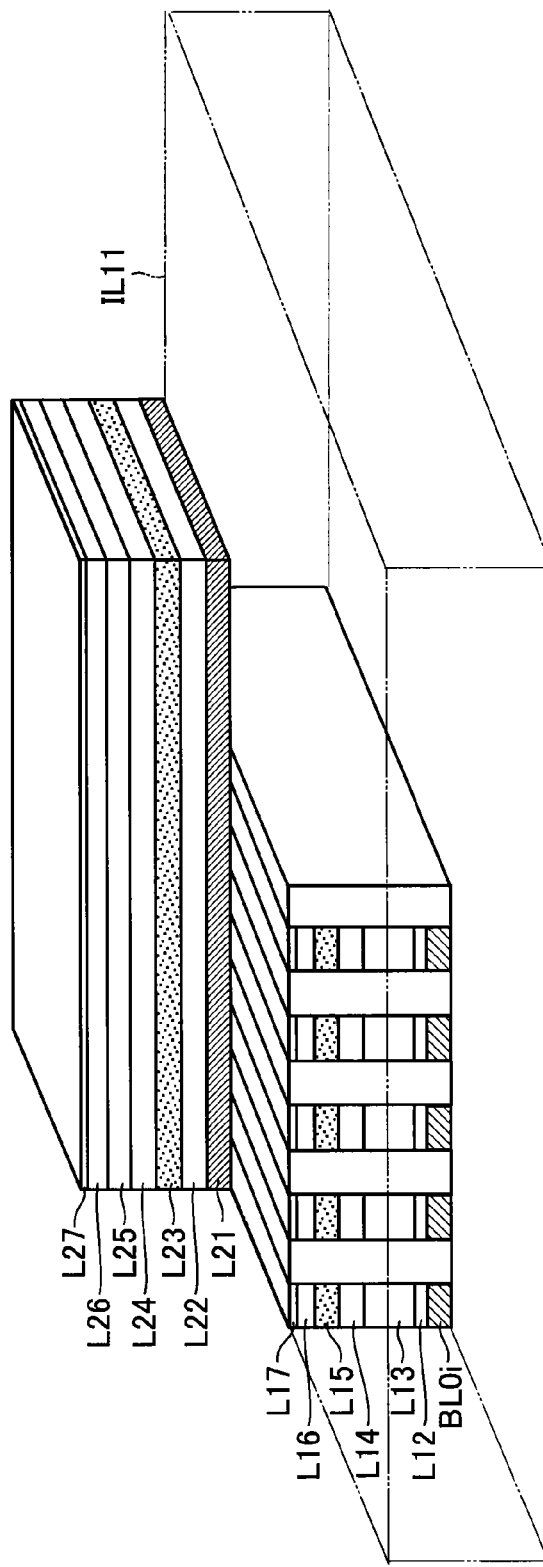
FIG. 12 is a perspective view illustrating the process of manufacturing the non-volatile semiconductor memory device according to the first embodiment.

Then, as shown in FIG. 12, layers L21 to L27 are sequentially deposited on the surface subjected to CMP. The layers L21 to L27 will become the word line WL0i, the electrode EL2, the variable resistive element VR, the electrode EL1, the non-ohmic element NO, the barrier metal BM, and the stopper ST later.

Figure 13:
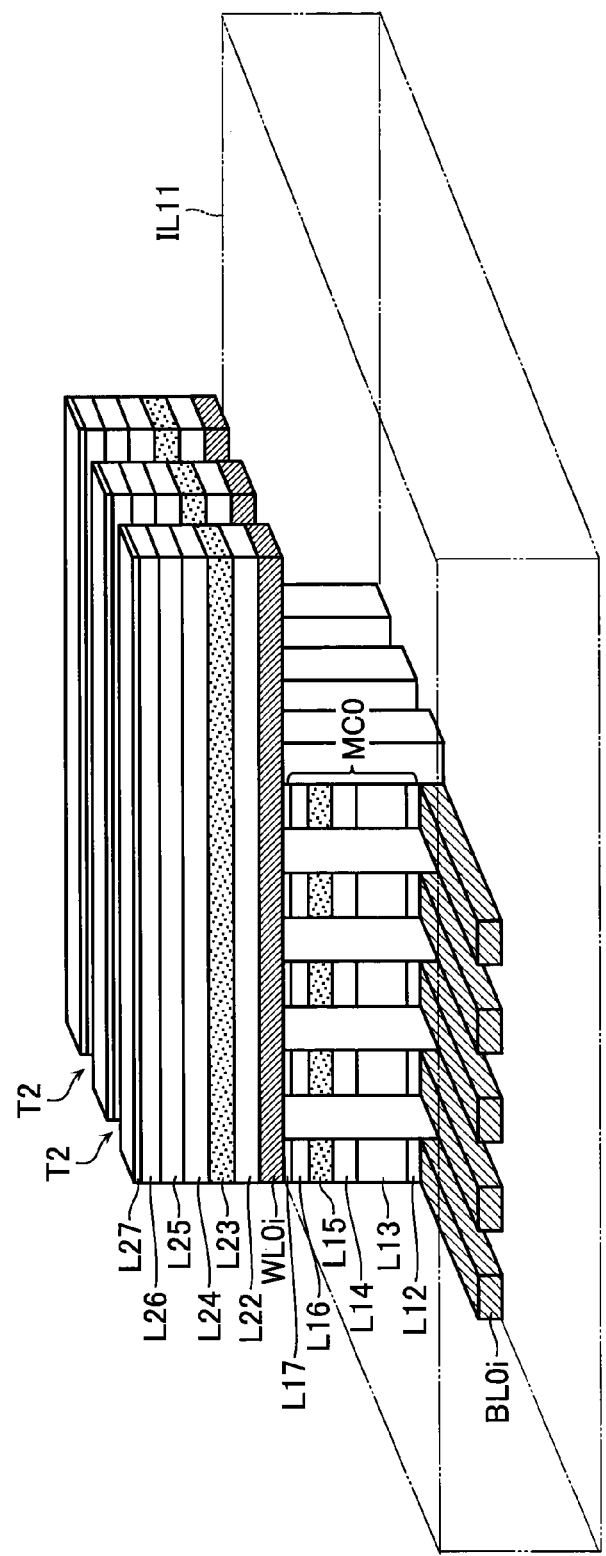
FIG. 13 is a perspective view illustrating the process of manufacturing the non-volatile semiconductor memory device according to the first embodiment.

Then, a hard mask (not shown), such as TEOS, is formed on the upper surface of the laminated structure shown in FIG. 12 and second anisotropic etching is performed using the mask. In this way, as shown in FIG. 13, grooves T2 passing through the layers L21 to L27 and the layers L12 to L17 are formed at predetermined pitches so as to extend in the row direction. The layer L21 becomes the word line WL0i.

The layers L12 to L17 become the barrier metal BM, the non-ohmic element NO, the electrode EL1, the variable resistive element VR, the electrode EL2, and the stopper ST by the process shown in FIG. 13. That is, the memory MC0 is formed by the process shown in FIG. 13.

Figure 14:
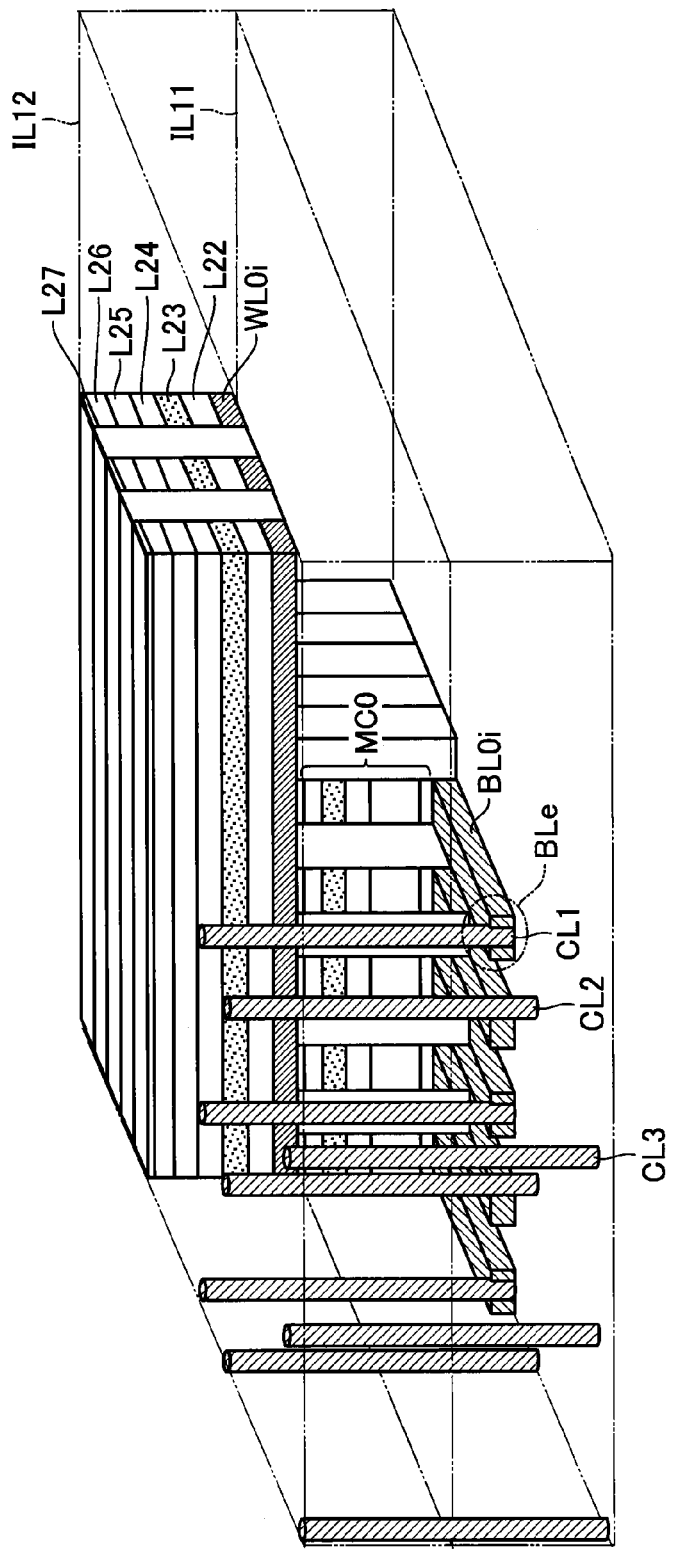
FIG. 14 is a perspective view illustrating the process of manufacturing the non-volatile semiconductor memory device according to the first embodiment.

Then, the grooves T2 are filled up with an interlayer insulating layer IL12. It is preferable that the interlayer insulating layer IL12 be made of a material with a high insulating performance, low capacitance, and good filling characteristics. Then, a planarizing process, such as CMP, is performed to remove the remaining interlayer insulating layer IL12 and expose the layer L27. The layer L27 (to be stopper ST later) has a function of stopping the planarizing process, such as CMP, at a predetermined position in the laminated direction. FIG. 14 is a cross-sectional view after the planarizing process.

In the process shown in FIG. 14, the contact plugs CL1 to CL3 are formed in the peripheral area AR2 so as to pass through the interlayer insulating layers IL11 and IL12. The contact plug CL1 is formed so as to come into contact with the upper surface and a side portion of the contact connection portion BLe of the bit line BL0i. The contact plugs CL1 to CL3 are formed so as to come into contact with the lower wiring M1 (see FIG. 7) that is disposed below the bit line BL0i.

Then, layers L31 to L37 are sequentially deposited on the surface shown in FIG. 14 subjected to CMP. The layers L31 to L37 will become the bit line BL1i, the barrier metal BM, the non-ohmic element NO, the electrode EL1, the variable resistive element VR, the electrode EL2, and the stopper ST later.

Figure 15:
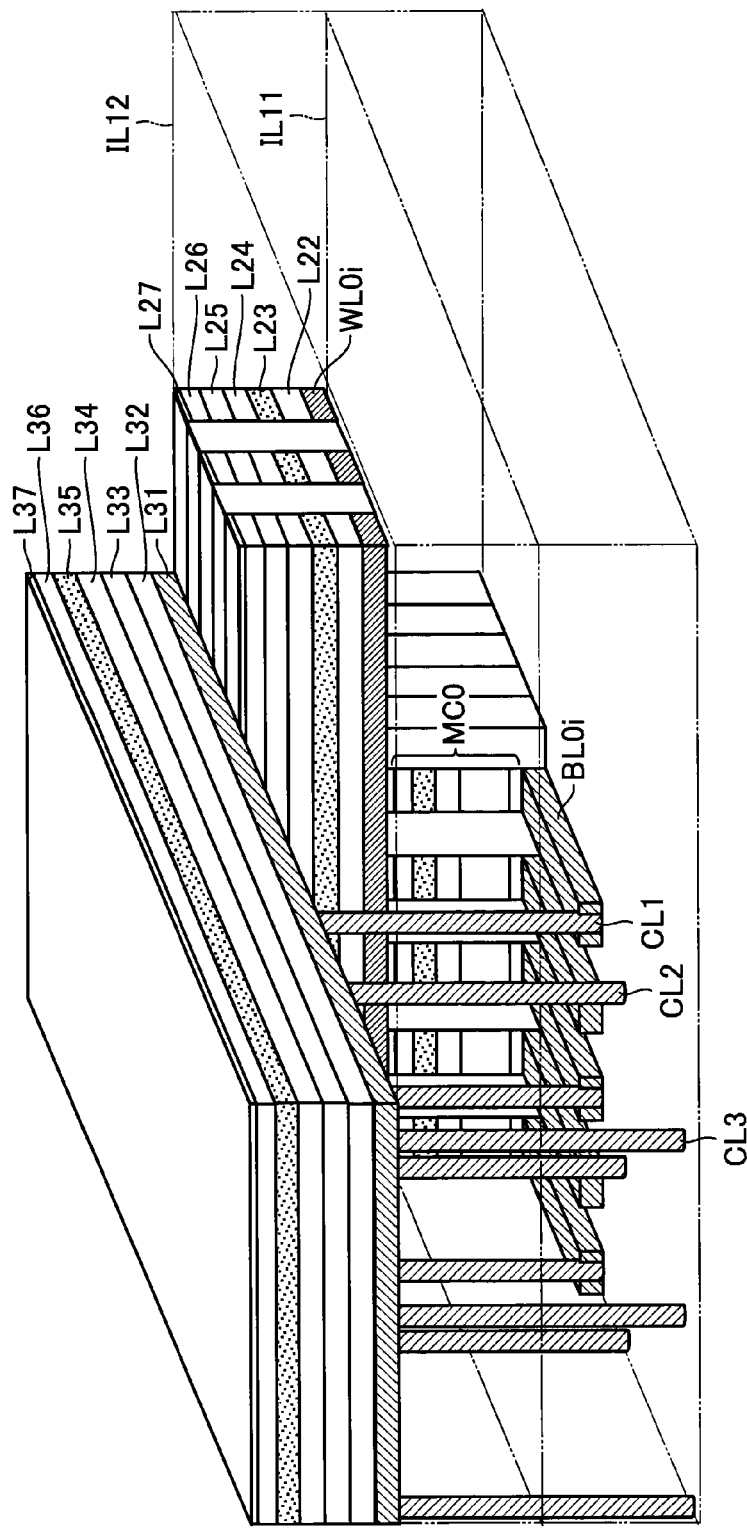
FIG. 15 is a perspective view illustrating the process of manufacturing the non-volatile semiconductor memory device according to the first embodiment.
Figure 16:
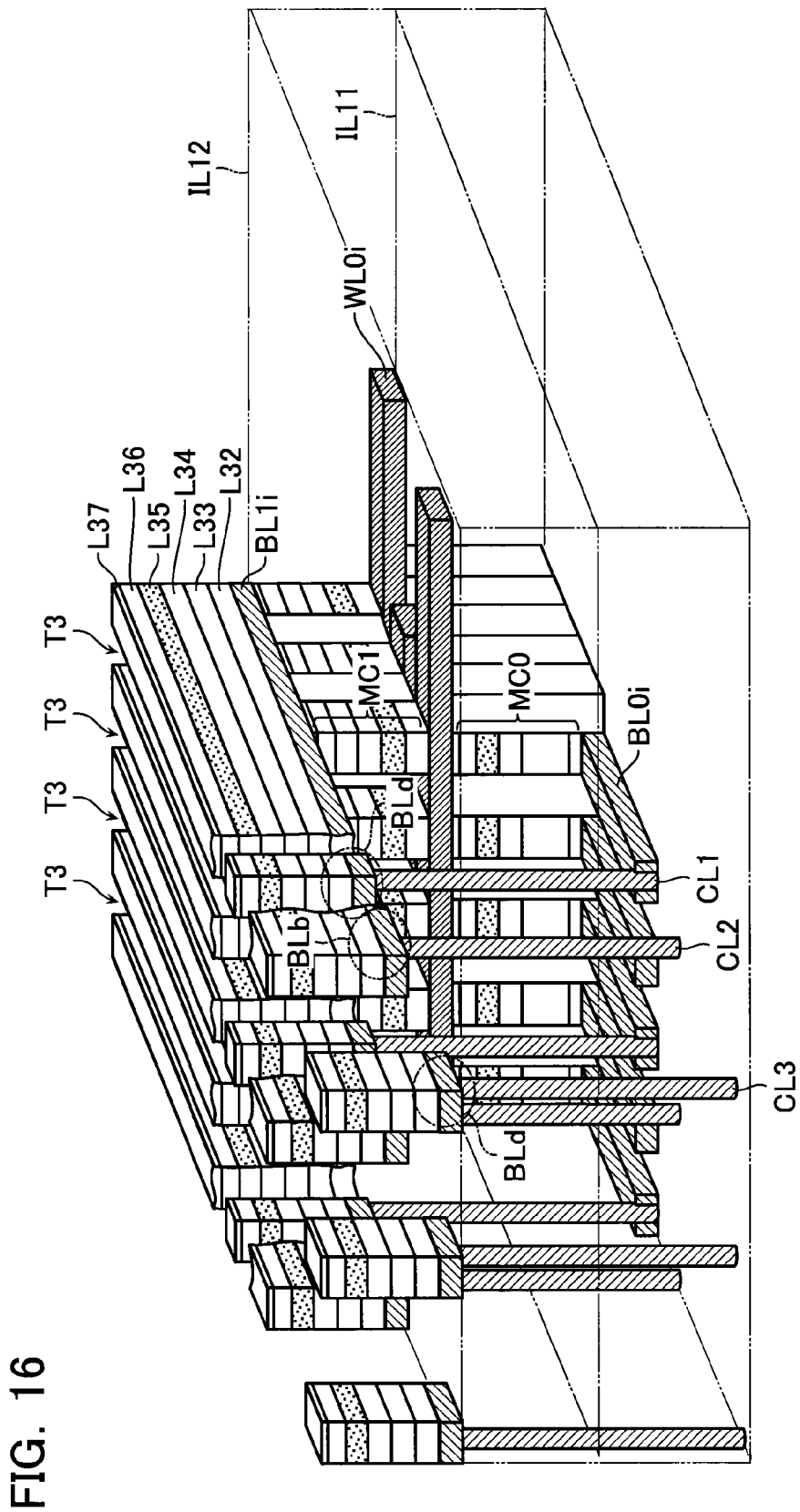
FIG. 16 is a perspective view illustrating the process of manufacturing the non-volatile semiconductor memory device according to the first embodiment.

Then, a hard mask (not shown), such as TEOS, is formed on the upper surface of the laminated structure shown in FIG. 15, and third anisotropic etching is performed using the mask. In this way, as shown in FIG. 16, grooves T3 passing through the layers L31 to L37 and the layers L22 to L27 are formed at predetermined pitches so as to extend in the column direction. The layer L31 becomes the bit line BL1i. The upper surface of the contact plug CL1 comes into contact with the island-shaped portion BLd of the bit line BL1i. The upper surface of the contact plug CL2 comes into contact with the contact connection portion BLb of the bit line BL1i. The upper surface of the contact plug CL3 comes into contact with the island-shaped portion BLd of the bit line BL1i.

The layers L22 to L27 become the electrode EL2, the variable resistive element VR, the electrode EL1, the non-ohmic element NO, the barrier metal BM, and the stopper ST by the process shown in FIG. 16. That is, the memory MC1 is formed by the process shown in FIG. 16.

Figure 17:
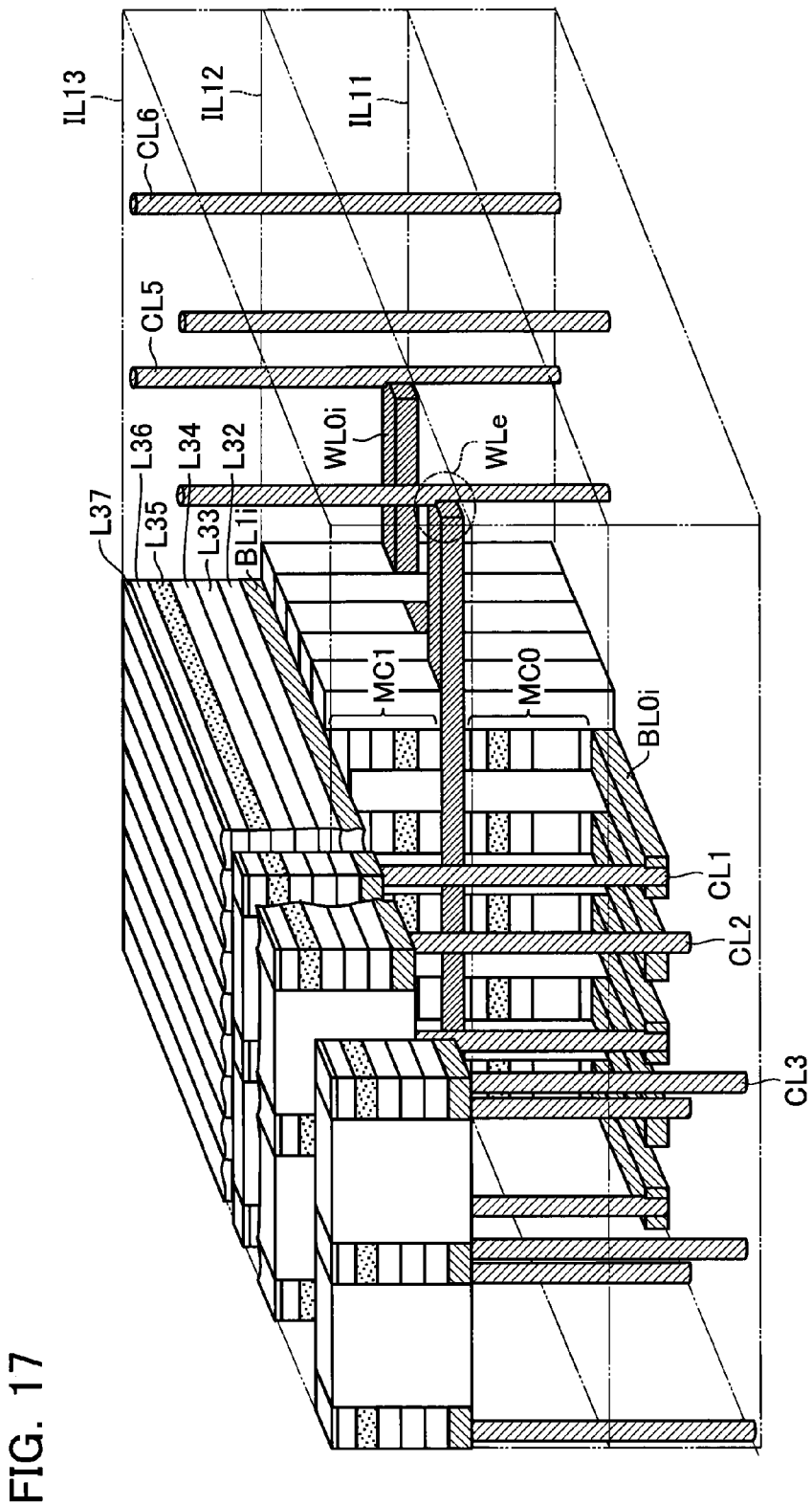
FIG. 17 is a perspective view illustrating the process of manufacturing the non-volatile semiconductor memory device according to the first embodiment.

Then, the grooves T3 are filled up with an interlayer insulating layer IL13. It is preferable that the interlayer insulating layer IL13 be made of a material with a high insulating performance, low capacitance, and good filling characteristics. Then, a planarizing process, such as CMP, is performed to remove the remaining interlayer insulating layer IL13 and expose the layer L37. The layer L37 (to be stopper ST later) has a function of stopping the planarizing process, such as CMP, at a predetermined position in the laminated direction. FIG. 17 is a cross-sectional view after the planarizing process.

In the process shown in FIG. 17, in the peripheral area AR2, the contact plugs CL5 and CL6 are formed so as to pass through the interlayer insulating layers IL11 to IL13. The contact plug CL5 is formed so as to come into contact with the upper surface and a side portion of the contact connection portion WLe of the word line WL0i. The contact plugs CL5 and CL6 are formed so as to come into contact with the lower wiring M1 (see FIG. 7) disposed below the bit line BL0i.

Figure 18:
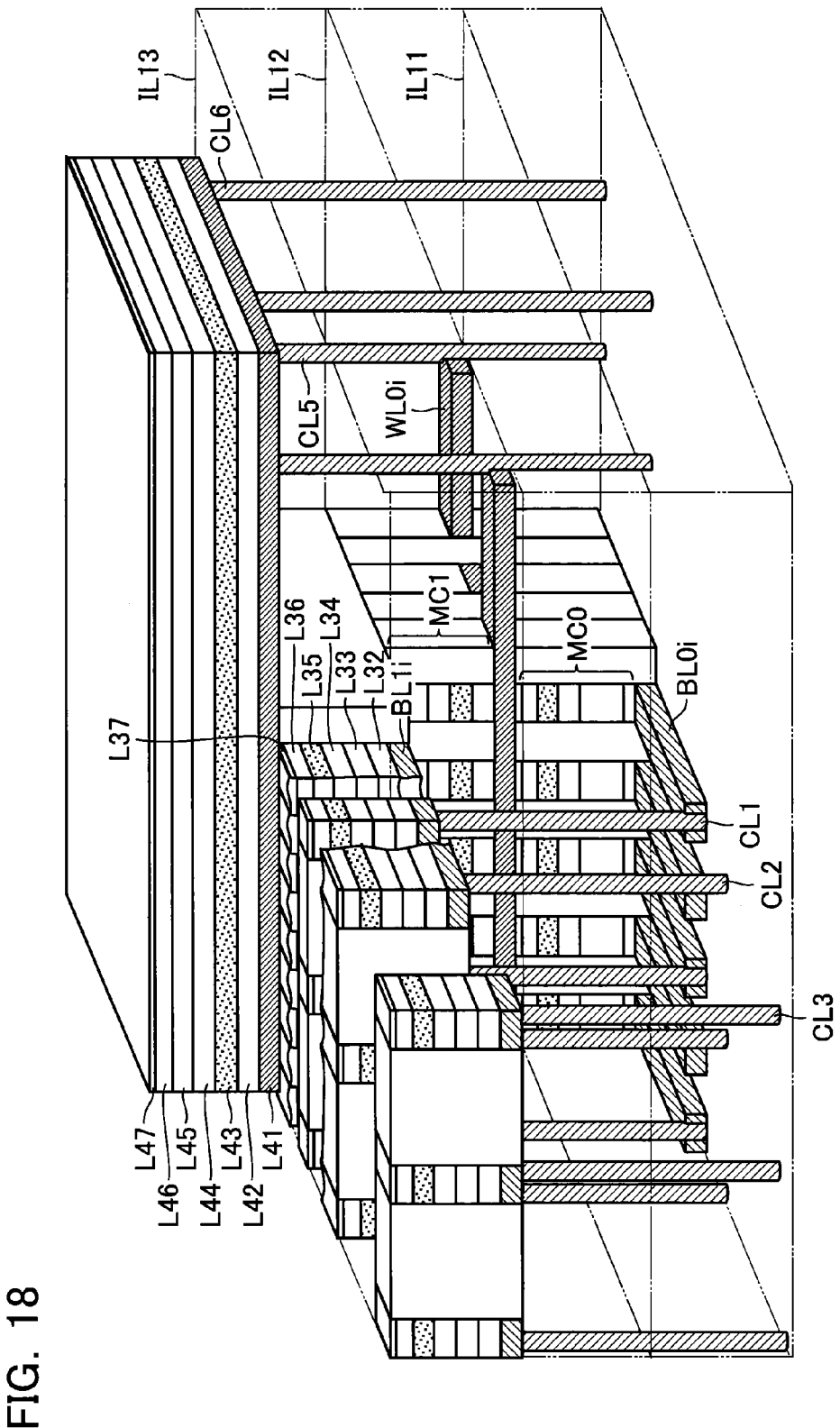
FIG. 18 is a perspective view illustrating the process of manufacturing the non-volatile semiconductor memory device according to the first embodiment.

Then, as shown in FIG. 18, layers L41 to L47 are sequentially deposited on the surface shown in FIG. 17 subjected to CMP. The layers L41 to L47 respectively become the word line WL1i, the electrode EL2, the variable resistive element VR, the electrode EL1, the non-ohmic element NO, the barrier metal BM, and the stopper ST later.

Figure 19:
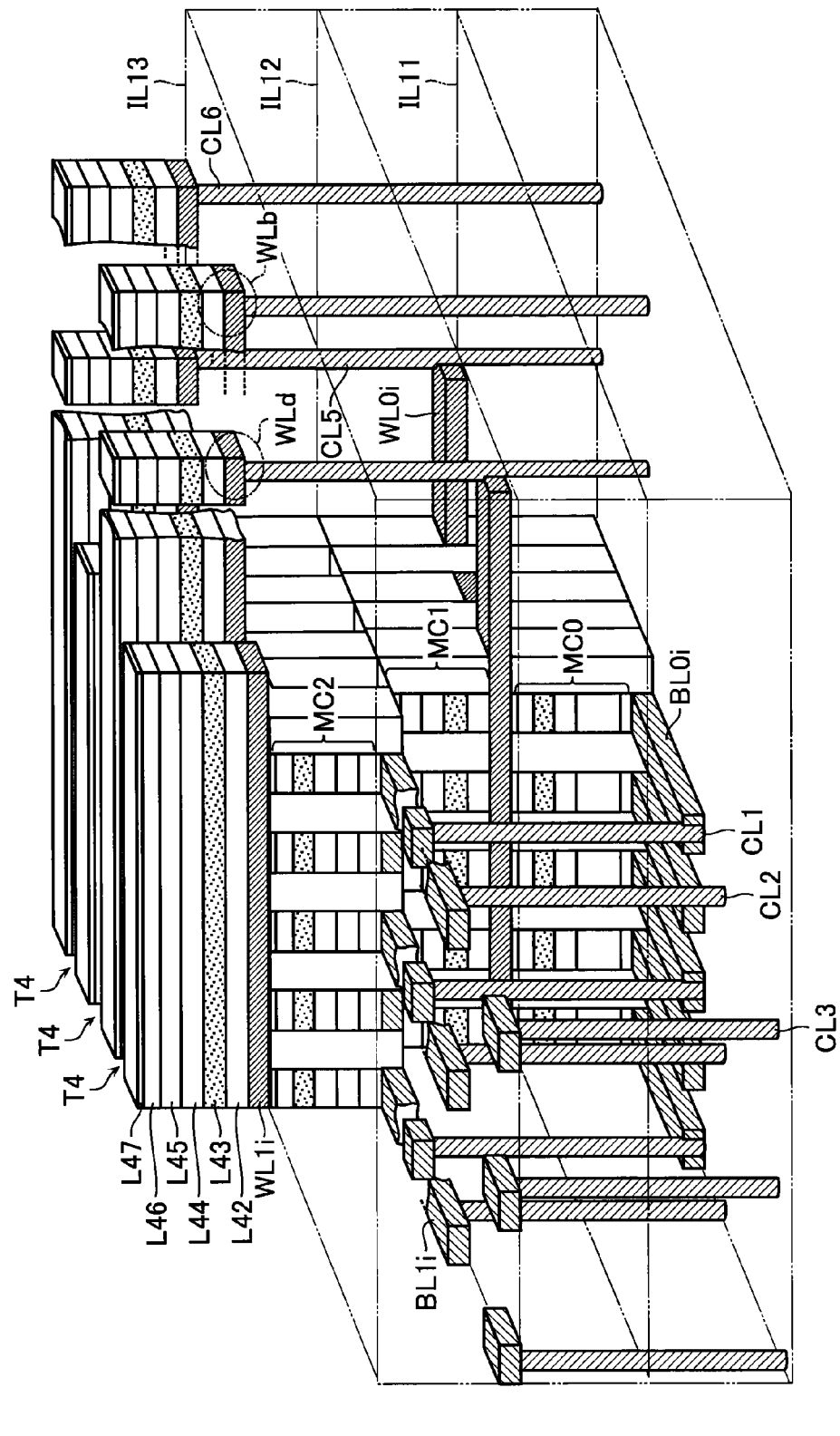
FIG. 19 is a perspective view illustrating the process of manufacturing the non-volatile semiconductor memory device according to the first embodiment.

Then, a hard mask (not shown), such as TEOS, is formed on the upper surface of the laminated structure shown in FIG. 18, and fourth anisotropic etching is performed using the mask. In this way, as shown in FIG. 19, grooves T4 passing through the layers L41 to L47 and the layers L32 to L37 are formed at predetermined pitches so as to extend in the row direction. The layer L41 becomes the word line WL1i. The upper surface of the contact plug CL5 comes into contact with the island-shaped portion WLd of the word line WL1i. The upper surface of the contact plug CL6 comes into contact with the contact connection portion BLb of the bit line BL1i.

The layers L32 to L37 become the barrier metal BM, the non-ohmic element NO, the electrode EL1, the variable resistive element VR, the electrode EL2, and the stopper ST by the process shown in FIG. 19. That is, the memory MC2 is formed by the process shown in FIG. 19.

Figure 20:
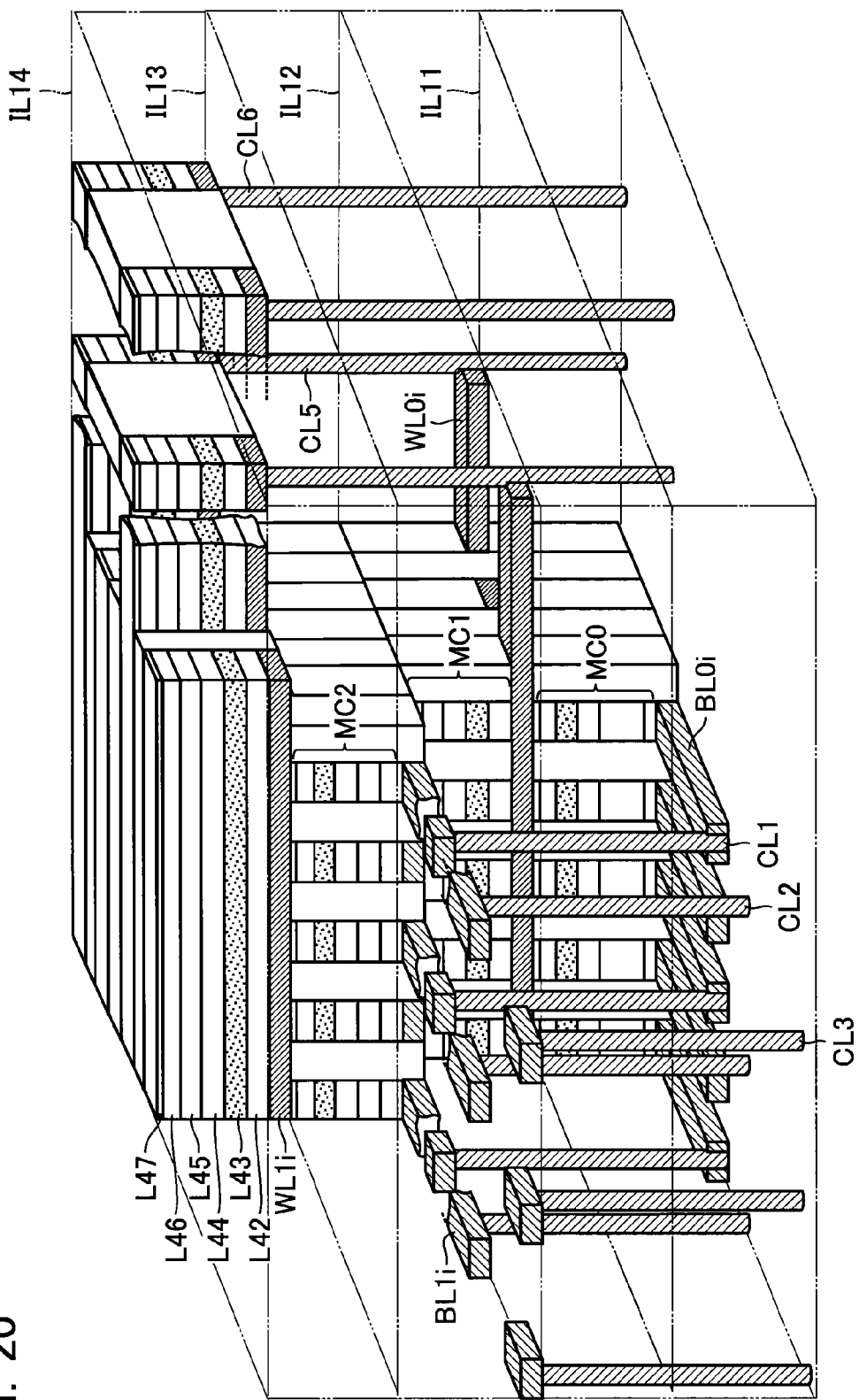
FIG. 20 is a perspective view illustrating the process of manufacturing the non-volatile semiconductor memory device according to the first embodiment.

Then, the grooves T4 are filled up with an interlayer insulating layer IL14. It is preferable that the interlayer insulating layer IL14 be made of a material with a high insulating performance, low capacitance, and good filling characteristics. Then, a planarizing process, such as CMP, is performed to remove the remaining interlayer insulating layer IL14 and expose the layer L47. The layer L47 (to be stopper ST later) has a function of stopping the planarizing process, such as CMP, at a predetermined position in the laminated direction. FIG. 20 is a cross-sectional view after the planarizing process.

Figure 21:
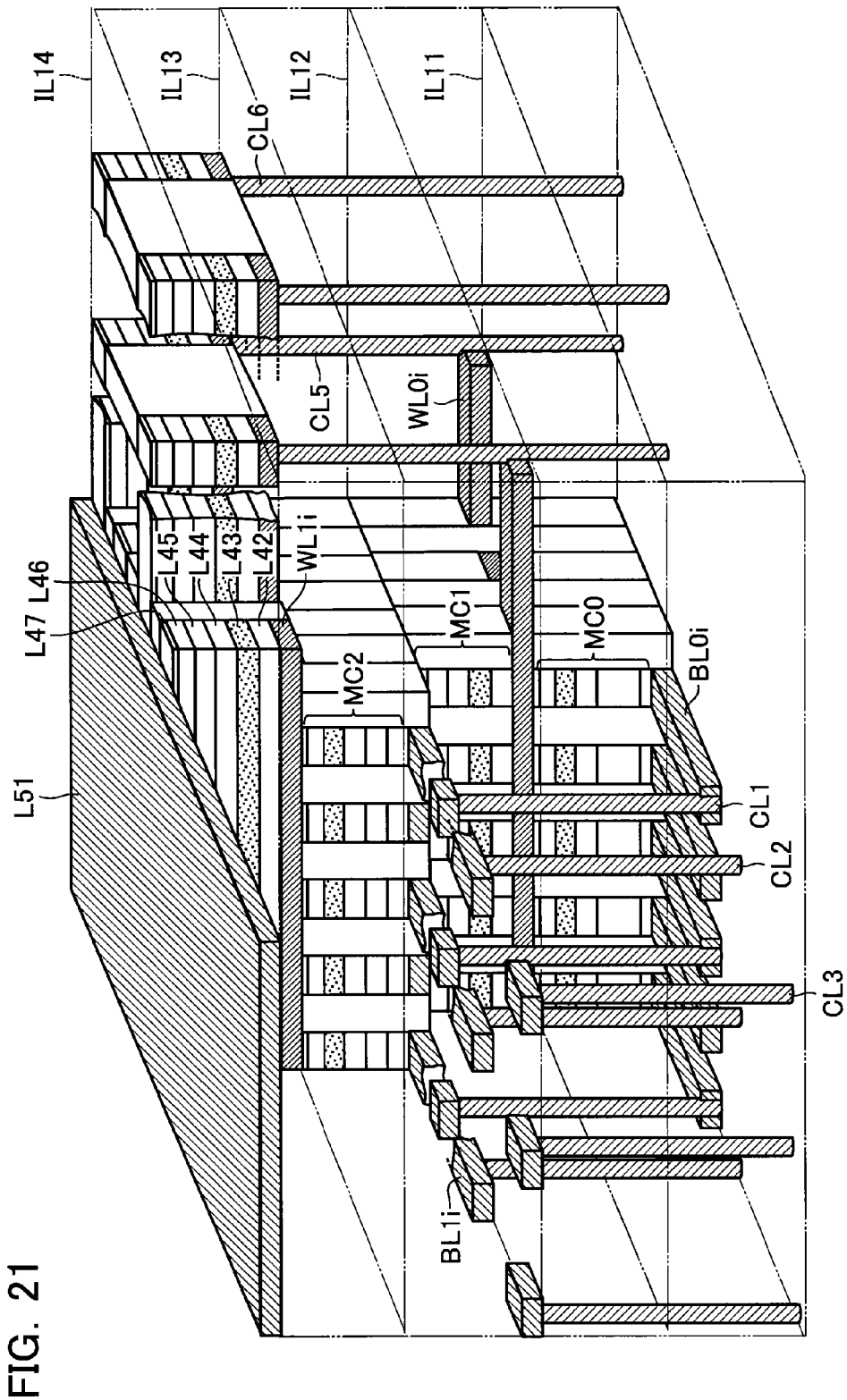
FIG. 21 is a perspective view illustrating the process of manufacturing the non-volatile semiconductor memory device according to the first embodiment.

Then, as shown in FIG. 21, a layer L51 is formed on the surface shown in FIG. 20 subjected to CMP. The layer L51 becomes the bit line BL2i later.

Figure 22:
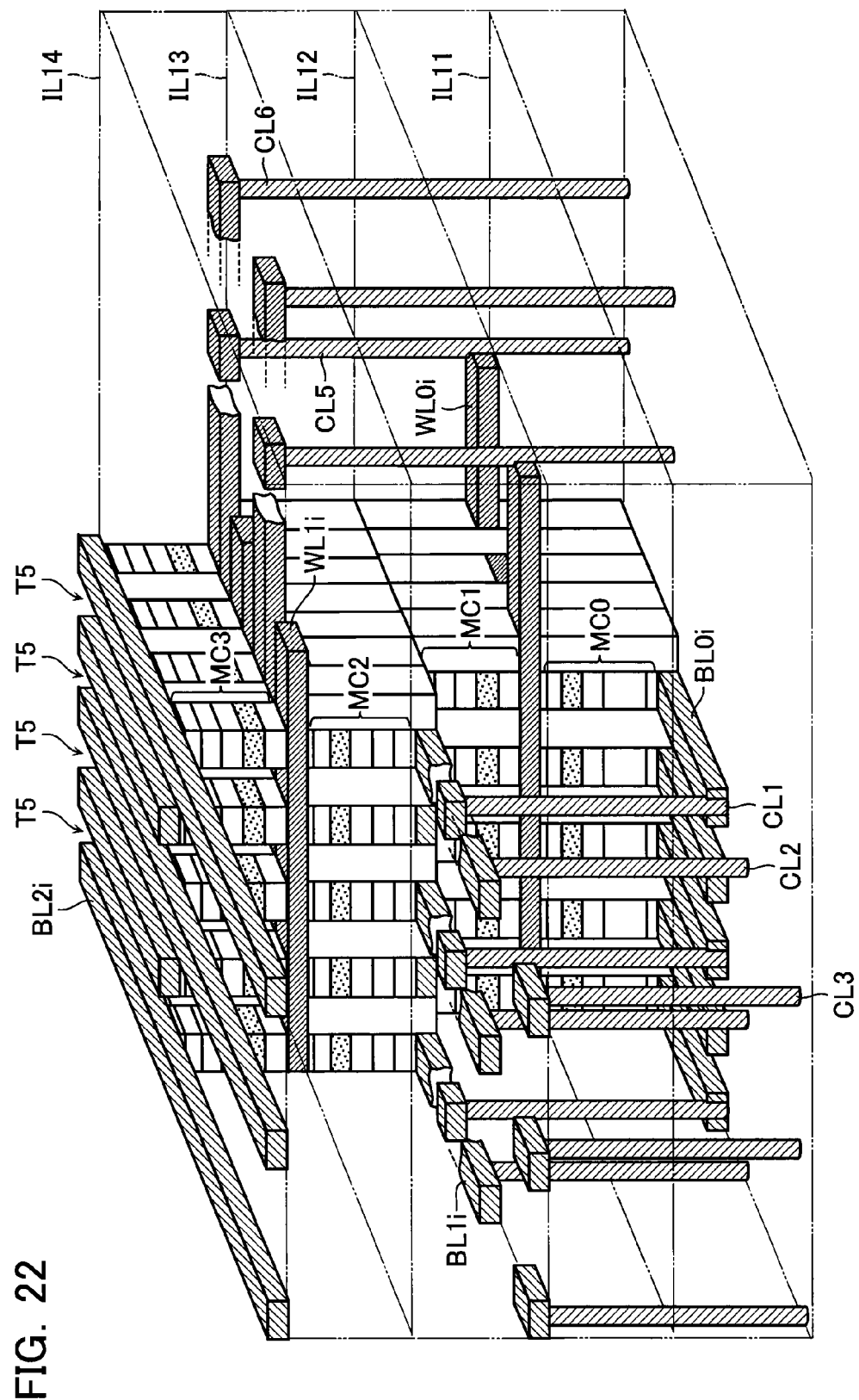
FIG. 22 is a perspective view illustrating the process of manufacturing the non-volatile semiconductor memory device according to the first embodiment.

Then, a hard mask (not shown), such as TEOS, is formed on the upper surface of the layer L51 shown in FIG. 21, and fifth anisotropic etching is performed using the mask. In this way, as shown in FIG. 22, grooves T5 passing through the layer L51 and the layers L42 to L47 are formed at predetermined pitches so as to extend in the column direction. The layer L51 becomes the bit line WL2i.

The layers L42 to L47 become the electrode EL2, the variable resistive element VR, the electrode EL1, the non-ohmic element NO, the barrier metal BM, and the stopper ST by the process shown in FIG. 22. That is, the memory MC3 is formed by the process shown in FIG. 22.

Figure 23:
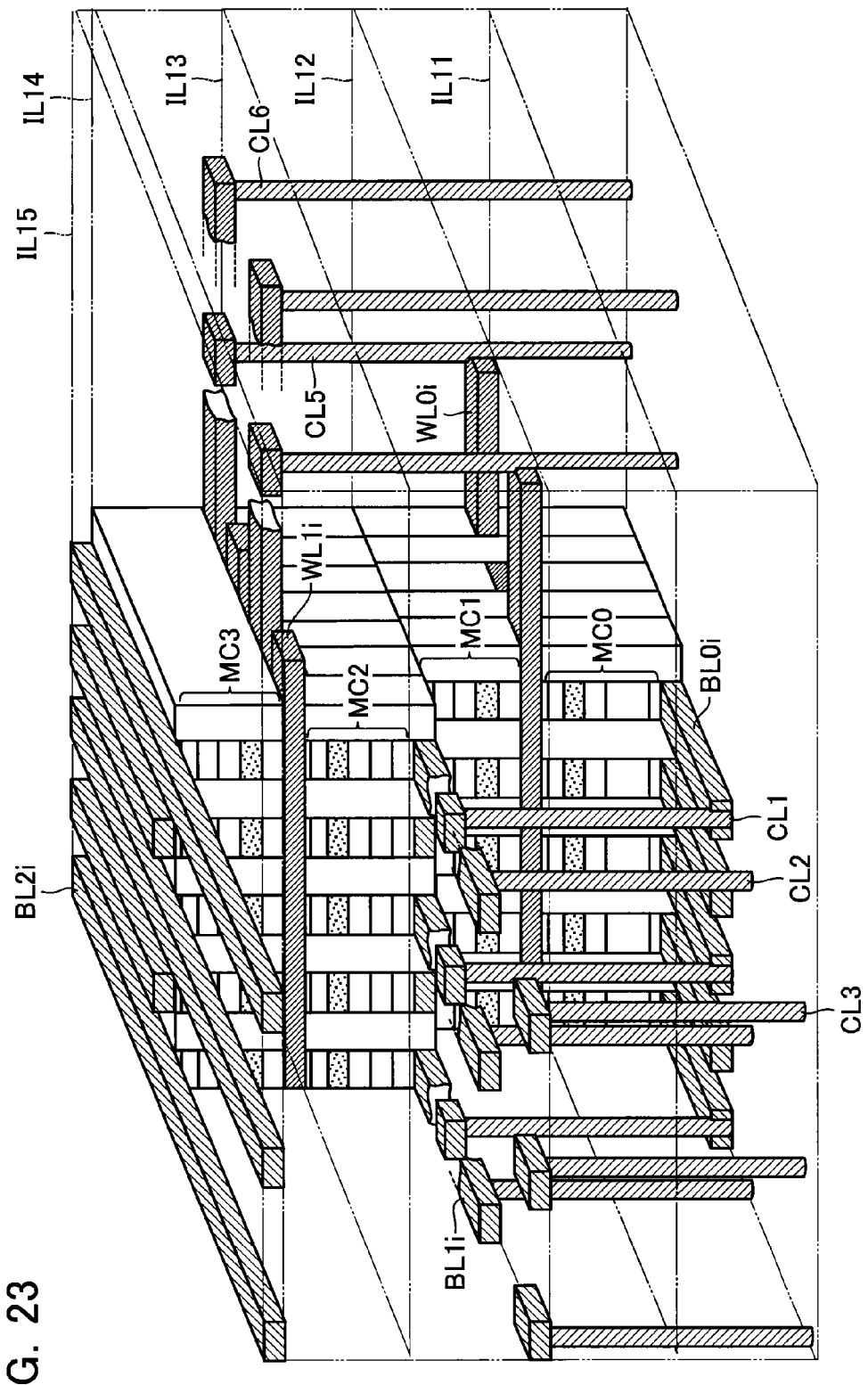
FIG. 23 is a perspective view illustrating the process of manufacturing the non-volatile semiconductor memory device according to the first embodiment.

Then, the grooves T5 are filled up with an interlayer insulating layer IL15. It is preferable that the interlayer insulating layer IL15 be made of a material with a high insulating performance, low capacitance, and good filling characteristics. FIG. 23 is a cross-sectional view after the process.

Figure 24:
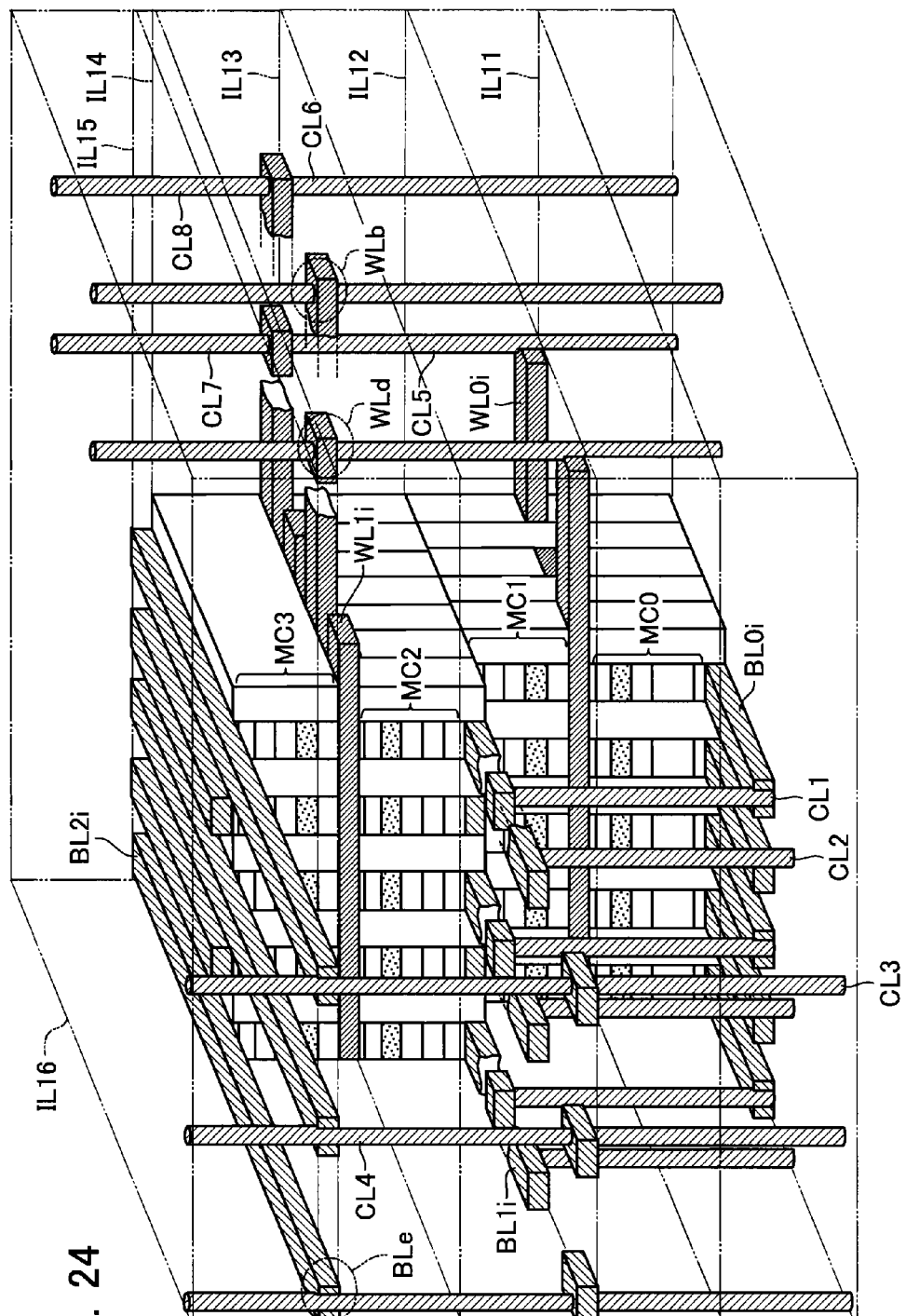
FIG. 24 is a perspective view illustrating the process of manufacturing the non-volatile semiconductor memory device according to the first embodiment.

Then, an interlayer insulating layer IL16 is formed on the interlayer insulating layer IL15. Then, the contact plug CL4 is formed so as to pass through the interlayer insulating layers IL16 to IL13. The contact plug CL4 is formed so as to come into contact with the upper surface and a side portion of the contact connection portion BLe of the bit line BL2$i$. In addition, the contact plug CL4 is formed so as to come into contact with the upper surface of the island-shaped portion BLd of the bit line BL1$i$. The contact plugs CL7 and CL8 are formed so as to pass through the interlayer insulating layers IL16 to IL14. The contact plug CL7 is formed so as to come into contact with the upper surface of the island-shaped portion WLd of the word line WL1$i$. The contact plug CL8 is formed so as to come into contact with the upper surface of the contact connection portion WLb of the word line WL1$i$. FIG. 24 is a cross-sectional view after these processes.

Then, the upper wiring layer M2 is formed on the interlayer insulating layer IL16 (the upper surfaces of the contact plugs CL4, CL7, and CL8). In this way, the non-volatile semiconductor memory device shown in FIG. 8 is manufactured.

The main part of the above-mentioned manufacturing process will be described in other words as follows. That is, first, the layer L11 forming the bit line BL0$i$ (first wiring) and the layers L12 to L17 forming the memory cell MC0 are sequentially laminated to form a first laminated structure (layers L11 to L17). Then, the first laminated structure is etched in a strip shape that extends in the column direction (first direction). Then, the layer L21 forming the word line WL0$i$ (second wiring) and the layers L22 to L27 forming the memory cell MC1 are sequentially laminated on the first laminated structure to form a second laminated structure (layers L21 to L27). Then, the first laminated structure and the second laminated structure are etched in a strip shape extending in the row direction (second direction) except for the bit line BL0$i$. Then, the contact plugs CL1 to CL3 are formed so as to come into contact with the upper surface and the side portion of the bit line BL0$i$ included in the first laminated structure and to extend in the laminated direction to the upper surface of the second laminated structure. Then, the layer L31 forming the bit line BL1$i$ and the layers L32 to L37 forming the memory cell MC2 are sequentially laminated on the second laminated structure to form a third laminated structure (layers L31 to L37). Then, the second laminated structure and the third laminated structure are etched in a strip shape extending in the column direction except for the word line WL0$i$. Then, the contact plugs CL5 and CL6 are formed so as to come into contact with the upper surface and the side portion of the word line WL0$i$ included in the second laminated structure and to extend to the upper surface of the third laminated structure in the laminated direction.

(Effects of Non-Volatile Semiconductor Memory Device According to First Embodiment)

Next, the effects of the non-volatile semiconductor memory according to the first embodiment will be described. Since the non-volatile semiconductor memory device according to the first embodiment has the above-mentioned structure, it is possible to manufacture the non-volatile semiconductor memory device with a small number of lithography processes. That is, it is possible to reduce the manufacturing costs of the non-volatile semiconductor memory device according to the first embodiment. In addition, it is possible to reduce an alignment error of the non-volatile semiconductor memory device according to the first embodiment.

[Second Embodiment]

(Detailed Structure of Non-volatile Semiconductor Memory Device According to Second Embodiment)

Figure 25:
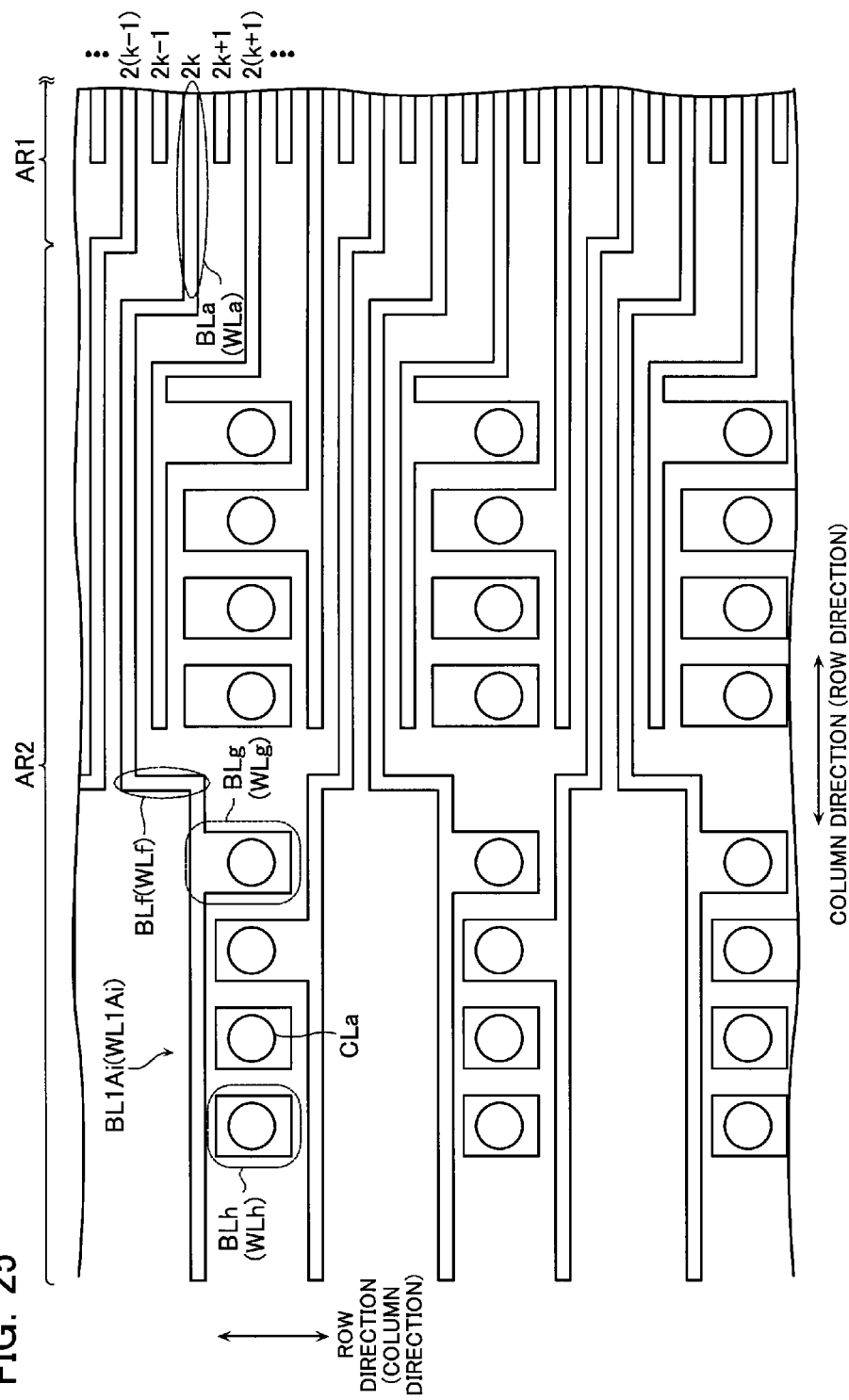
FIG. 25 is a top view illustrating a bit line BL1A$i$ according to a second embodiment.
Figure 26:
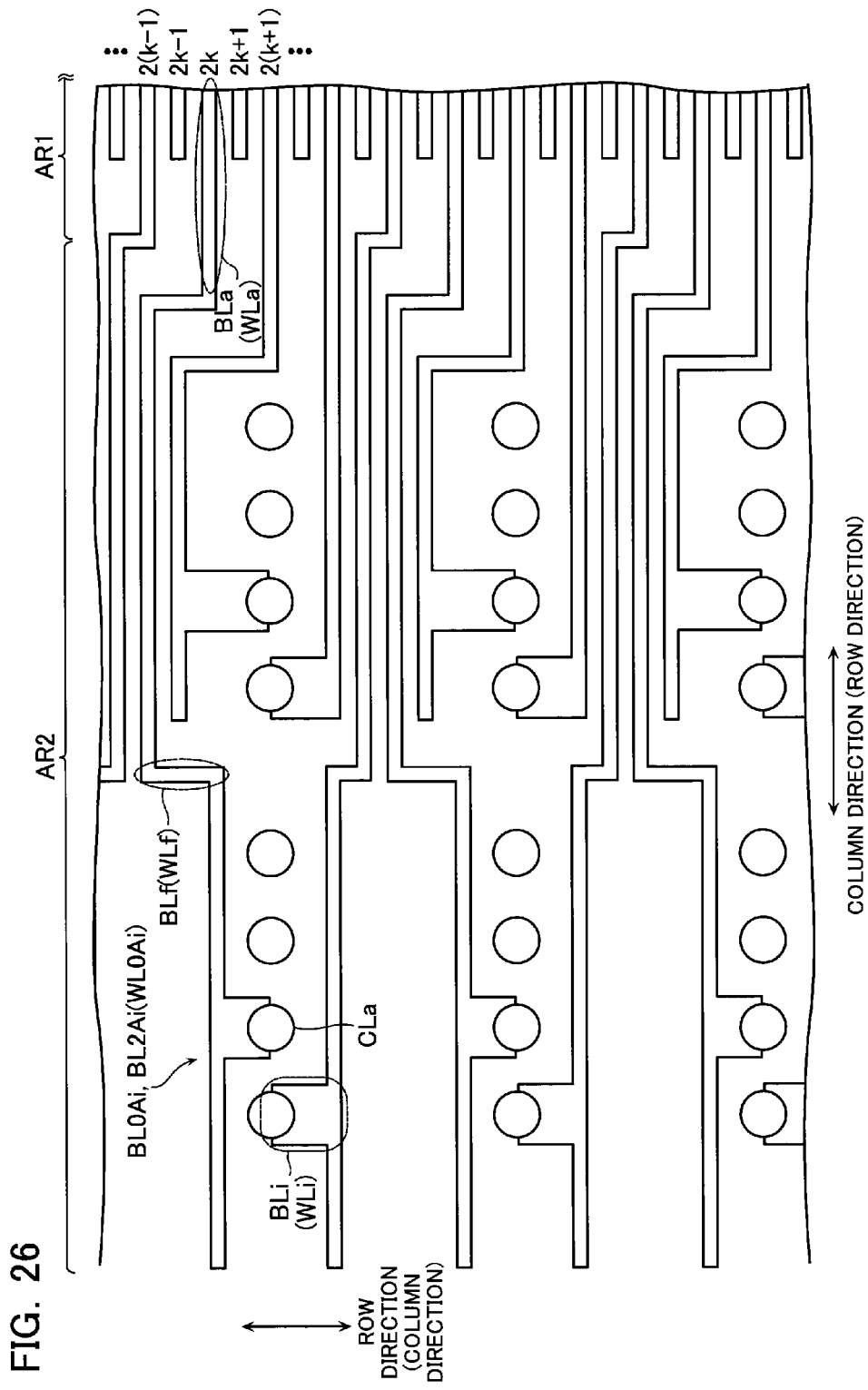
FIG. 26 is a top view illustrating bit lines BL0A$i$ and BL2A$i$ according to the second embodiment.

Next, the detailed structure of a non-volatile semiconductor memory device according to a second embodiment will be described with reference to FIGS. 25 and 26. FIG. 25 is a top view illustrating a bit line BL1Ai and FIG. 26 is a top view illustrating bit lines BL0Ai and BL2Ai. Word lines WL1Ai and WL0Ai have the same basic pattern as the bit lines except that they extend in a direction orthogonal to the direction in which the bit lines extend. Therefore, the reference numerals of the word lines are represented in parentheses '( )' for reference.

The non-volatile semiconductor memory device according to the second embodiment is similar to that according to the first embodiment except for only the shapes of the bit lines BL0Ai to BL2Ai (word lines WL0Ai and WL1Ai). In the second embodiment, the same components as those in the first embodiment are denoted by the same reference numerals, and a description thereof will be omitted.

As shown in FIG. 25, the bit line BL1Ai includes a third straight portion BLf instead of the second straight portion BLb. The third straight portion BLf is formed so as to extend in parallel to the row direction (a direction orthogonal to the column direction).

The bit line BL1Ai has a contact connection portion BLg and an island-shaped portion BLh that are different from those in the first embodiment. The contact connection portion BLg and the island-shaped portion BLh are formed such that the upper and lower surfaces thereof come into contact with a contact plug CLa (a circular shape as viewed from the upper side).

As shown in FIG. 25, the word line WL1Ai has a third straight portion WLf, a contact connection portion WLg, and an island-shaped portion WLh that are substantially the same as those of the bit line BL1Ai.

As shown in FIG. 26, each of the bit lines BL0Ai and BL2Ai has a third straight portion BLf instead of the second straight portion BLb. The bit line BL1Ai has a contact connection portion BLi different from that in the first embodiment. The contact connection portion BLi is formed such that the side surface thereof comes into contact with the contact plug CLa.

As shown in FIG. 26, the word line WL0Ai has a third straight portion WLf and a contact connection portion WLi that are substantially the same as those of each of the bit lines BL0Ai and BL2Ai.

(Effects of Non-Volatile Semiconductor Memory Device According to Second Embodiment)

As described above, since the non-volatile semiconductor memory device according to the second embodiment has substantially the same structure as that according to the first embodiment, the non-volatile semiconductor memory device has the same effects as those according to the first embodiment.

[Third Embodiment]

(Detailed Structure of Non-volatile Semiconductor Memory Device According to Third Embodiment)

Figure 27:
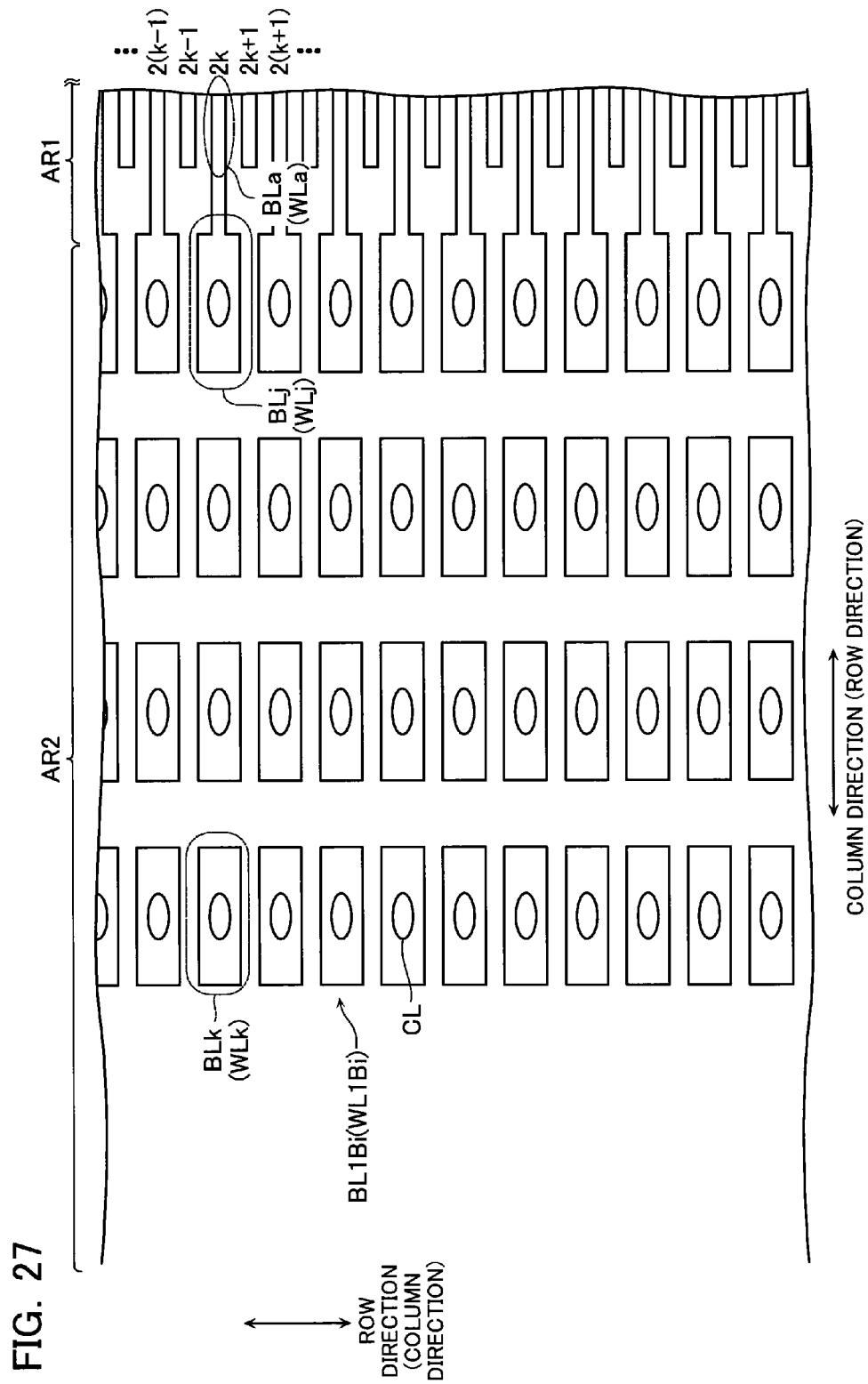
FIG. 27 is a top view illustrating a bit line BL1B$i$ according to a third embodiment.
Figure 28:
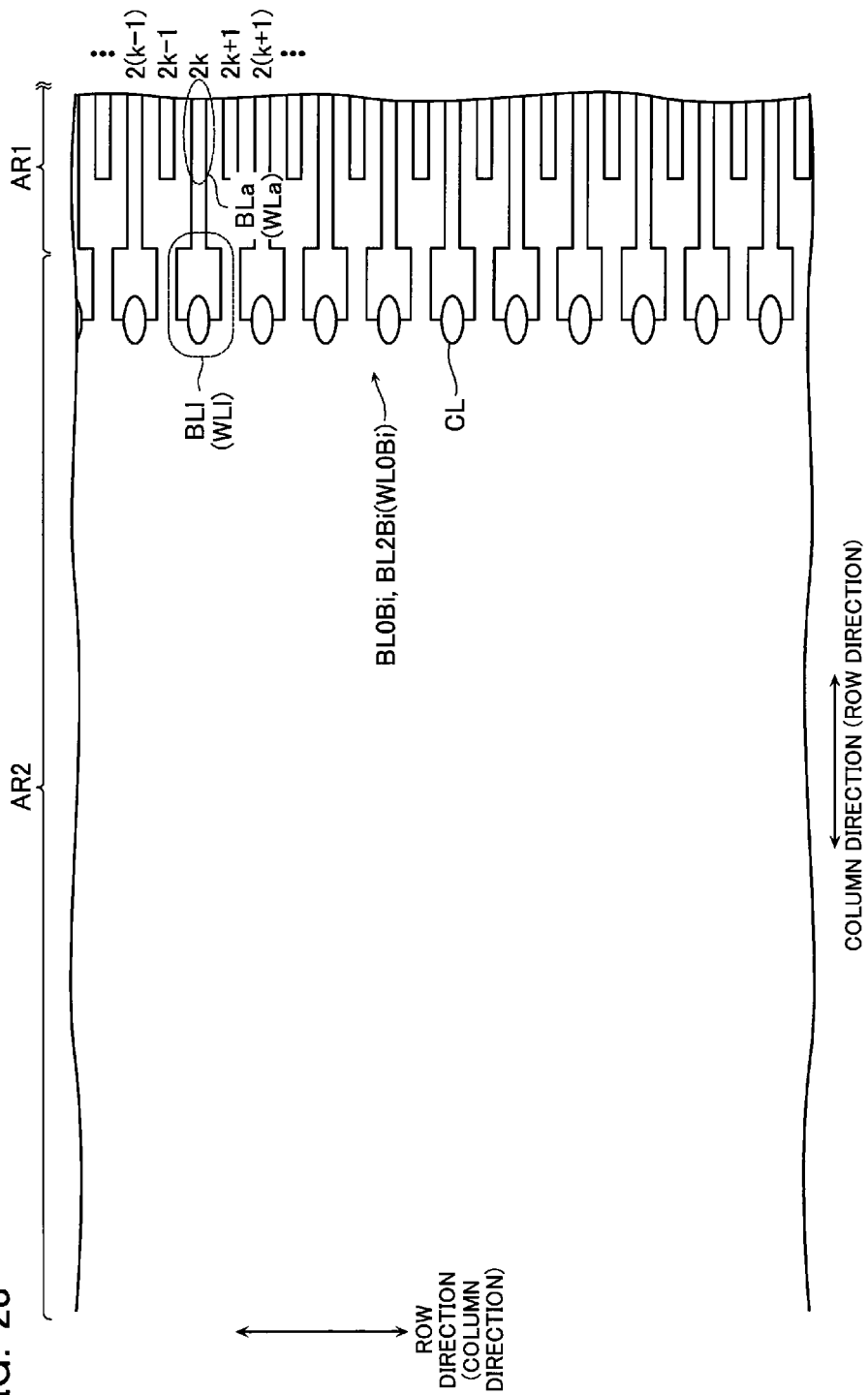
FIG. 28 is a top view illustrating bit lines BL0B$i$ and BL2B$i$ according to the third embodiment.

Next, the detailed structure of a non-volatile semiconductor memory device according to a third embodiment will be described with reference to FIGS. 27 and 28. FIG. 27 is a top view illustrating a bit line BL1Bi and FIG. 28 is a top view illustrating bit lines BL0Bi and BL2Bi. Word lines WL1Bi and WL0Bi have the same basic pattern as the bit lines except that they extend in a direction orthogonal to the direction in which the bit lines extend. Therefore, the reference numerals of the word lines are represented in parentheses '( )' for reference.

The non-volatile semiconductor memory device according to the third embodiment is similar to those according to the first and second embodiments except for only the shapes of the bit lines BL0Bi to BL2Bi (word lines WL0Bi and WL1Bi). In the third embodiment, the same components as those in the first and second embodiments are denoted by the same reference numerals, and a description thereof will be omitted.

As shown in FIG. 27, the bit line BL1Bi has a contact connection portion BLj different from those in the first and second embodiments. The contact connection portion BLj is formed such that the upper and lower surfaces thereof come into contact with the contact plug CL. The contact connection portion BLj is formed along the row direction at a predetermined position in the column direction.

The bit line BL1Bi has an island-shaped portion BLk different from those in the first and second embodiments. The island-shaped portions BLk are regularly arranged at a predetermined pitch from the contact connection portion BLj in the column direction. The island-shaped portion BLk is formed such that the upper and lower surfaces thereof come into contact with the contact plug CL.

As shown in FIG. 27, the word line WL1Bi has a contact connection portion WLj and an island-shaped portion WLk that are substantially the same as those of the bit line BL1Bi.

As shown in FIG. 28, each of the bit lines BL0Bi and BL2Bi has a contact connection portion BL1 different from those in the first and second embodiments. The contact connection portion BL1 is formed such that the side surface thereof comes into contact with the contact plug CL. The contact connection portion BL1 is formed at a predetermined position in the column direction.

As shown in FIG. 28, the word line WL0Ai has a contact connection portion WL1 that is substantially the same as those of the bit lines BL0Bi and BL2Bi.

(Effects of Non-Volatile Semiconductor Memory Device According to Third Embodiment)

As described above, since the non-volatile semiconductor memory device according to the third embodiment has substantially the same structure as that according to the first embodiment, the non-volatile semiconductor memory device has the same effects as those according to the first embodiment.

[Fourth Embodiment]

(Detailed Structure of Non-volatile Semiconductor Memory Device According to Fourth Embodiment)

Figure 29:
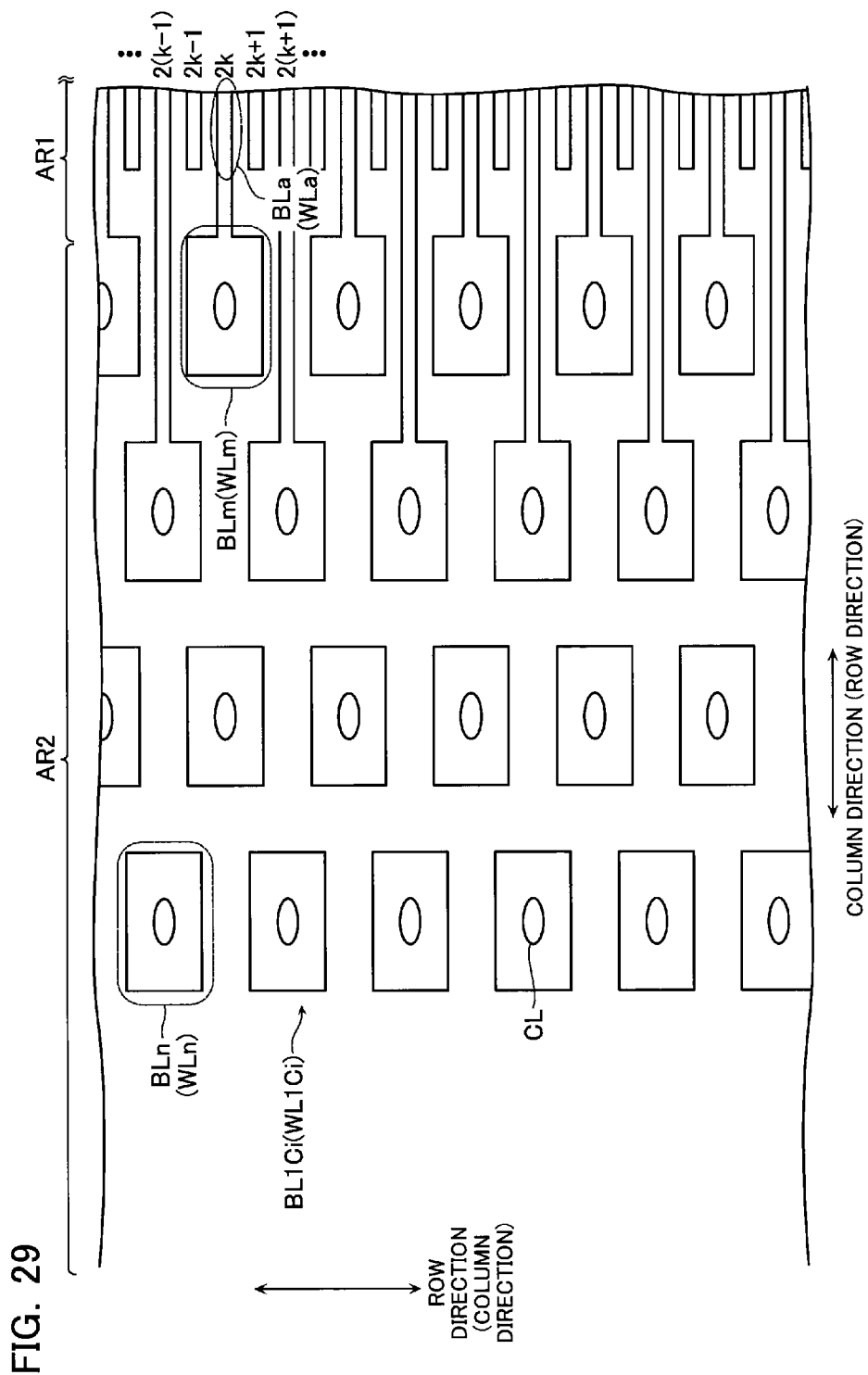
FIG. 29 is a top view illustrating a bit line BL1C$i$ according to a fourth embodiment.
Figure 30:
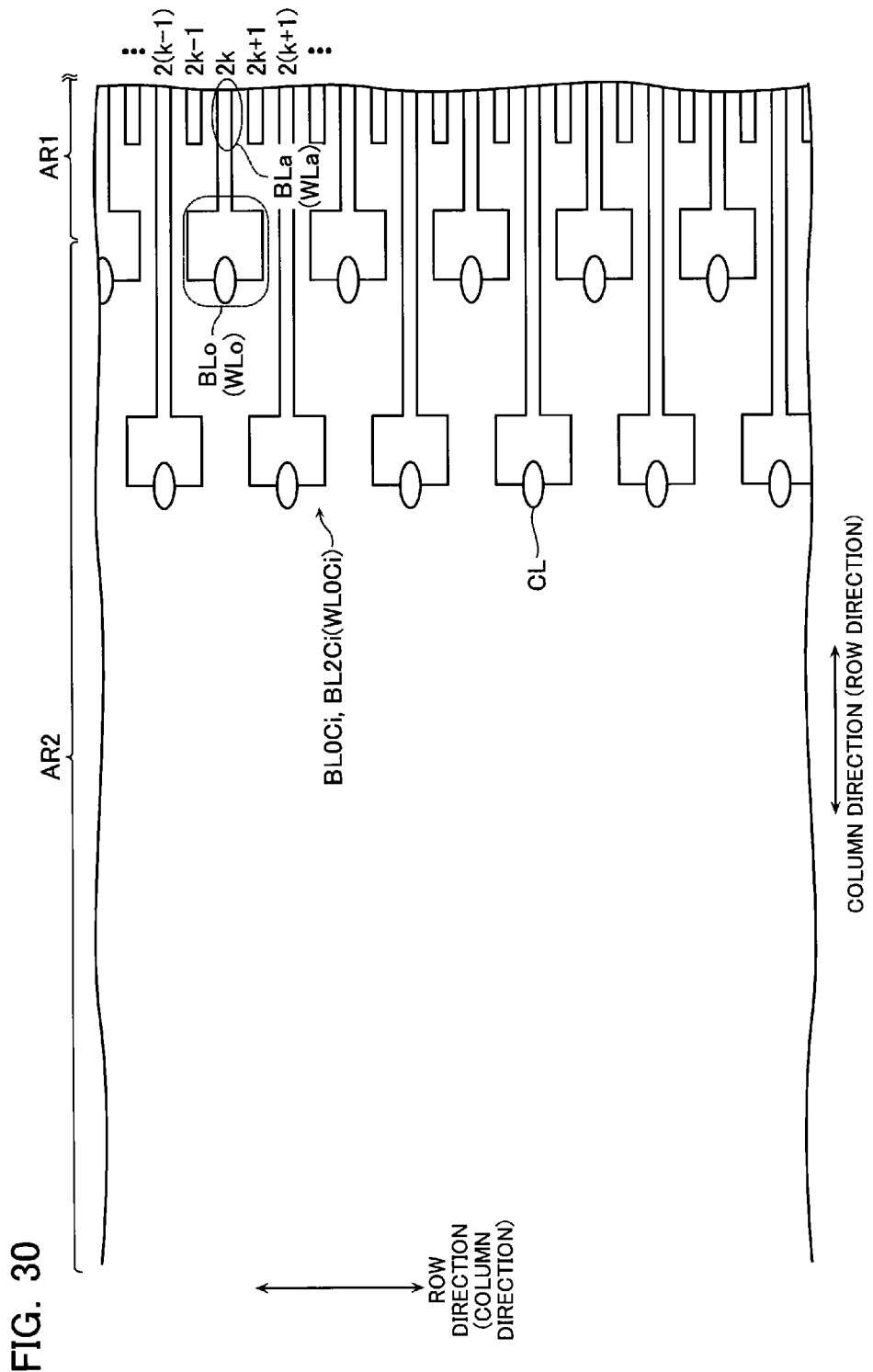
FIG. 30 is a top view illustrating bit lines BL0C$i$ and BL2C$i$ according to the fourth embodiment.

Next, the detailed structure of a non-volatile semiconductor memory device according to a fourth embodiment will be described with reference to FIGS. 29 and 30. FIG. 29 is a top view illustrating a bit line BL1Ci and FIG. 30 is a top view illustrating bit lines BL0Ci and BL2Ci. Word lines WL1Ci and WL0Ci have the same basic pattern as the bit lines except that they extend in a direction orthogonal to the direction in which the bit lines extend. Therefore, the reference numerals of the word lines are represented in parentheses '( )' for reference.

The non-volatile semiconductor memory device according to the fourth embodiment is similar to those according to the first to third embodiments except for only the shape of the bit lines BL0Ci to BL2Ci (word lines WL0Ci and WL1Ci). In the fourth embodiment, the same components as those in the first to third embodiments are denoted by the same reference numerals and a description thereof will be omitted.

As shown in FIG. 29, the bit line BL1Ci has a contact connection portion BLm which is different from those in the first to third embodiments. A (1+4n)-th (n is a natural number) bit line BL1Ci from a predetermined position in the row direction has a contact connection portion BLm. The contact connection portions BLm are provided along the row direction at a first position in the column direction. A (3+4n)-th bit line BL1Ci from a predetermined position in the row direction has a contact connection portion BLm. The contact connection portion BLm are provided along the row direction at a second position in the column direction. The contact connection portion BLm is formed such that the upper and lower surfaces thereof come into contact with the contact plug CL.

The bit line BL1Ci has an island-shaped portion BLn which is different from those in the first to third embodiments. The island-shaped portion BLn is arranged at a predetermined pitch from the contact connection portion BL1 in the column direction. The island-shaped portion BLn is formed such that the upper and lower surfaces thereof come into contact with the contact plug CL.

As shown in FIG. 29, the word line WL1Ci has a contact connection portion WLm and an island-shaped portion WLn which are substantially the same as those of the bit line BL1Ci.

As shown in FIG. 30, each of the bit lines BL0Ci and BL2Ci has a contact connection portion BLo which is different from those in the first to third embodiments. (1+4n)-th (n is a natural number) bit lines BL0Ci and BL2Ci from a predetermined position in the row direction each have the contact connection portion BLo provided along the row direction at a first position in the column direction. (3+4n)-th bit lines BL10Ci and BL2Ci from a predetermined position in the row direction each have the contact connection portion BLo provided along the row direction at a second position in the column direction. The contact connection portion BLo is formed such that the upper surface and a side portion thereof come into contact with the contact plug CL.

As shown in FIG. 30, the word line WL0Ci has a contact connection portion WLo which is substantially the same as those of the bit lines BL0Ci and BL2Ci.

(Effects of Non-volatile Semiconductor Memory Device According to Fourth Embodiment)

As described above, since the non-volatile semiconductor memory device according to the fourth embodiment has substantially the same structure as that according to the first embodiment, the non-volatile semiconductor memory device has the same effects as those according to the first embodiment.

[Other Embodiments]

The non-volatile semiconductor memory devices according to the first to fourth embodiments have been described above, but the invention is not limited to the embodiments. Additions, omissions, substitutions, and other modifications can be made without departing from the spirit or scope of the present invention.

Figure 31:
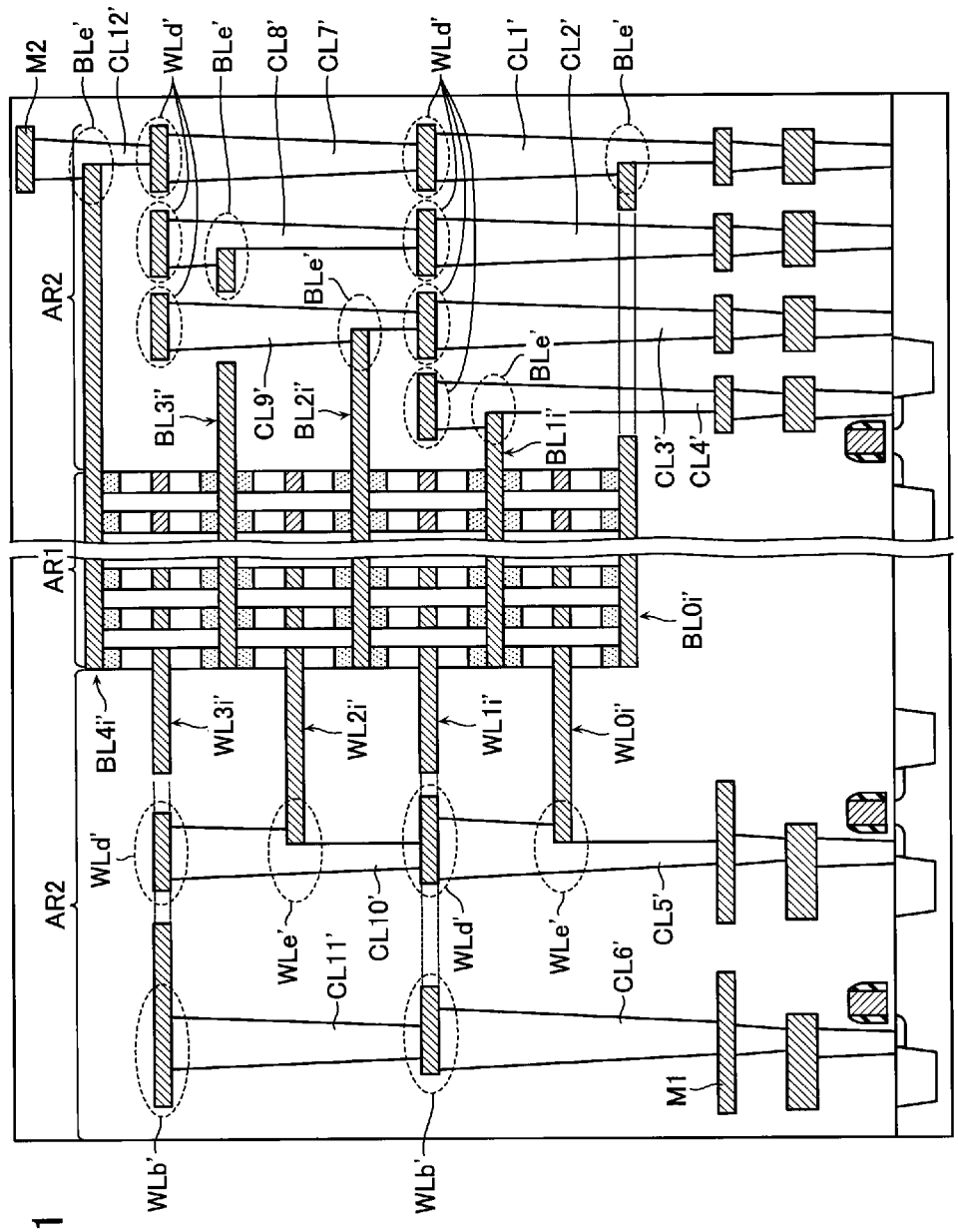
FIG. 31 is a diagram schematically illustrating the connection of contact plugs CL1' to CL12' according to another embodiment.

The non-volatile semiconductor memory device according to the first embodiment includes the bit line BL0$i$, the word line WL0$i$, the bit line BL1$i$, the word line WL1$i$, and the bit line BL2$i$ arranged in this order from the lower side. However, the invention is not limited to the structure. As shown in FIG. 31, the non-volatile semiconductor memory device according to the invention may include a bit line BL0$i$', a word line WL0$i$', a bit line BL1$i$', a word line WL1$i$', a bit line BL2$i$', a word line WL2$i$', a bit line BL3$i$', a word line WL3$i$', and a bit line BL4$i$' arranged in this order from the lower side.

The non-volatile semiconductor memory device shown in FIG. 31 includes contact plugs CL1' to CL12'.

The contact plugs CL1' to CL6' extend in the laminated direction from a lower wiring M1 to a layer having a word line WL1i' formed thereon. Each of the contact plugs CL1' to CL5' comes into contact with the lower surface of an island-shaped portion WLd' of the word line WL1i'. The contact plug CL6' comes into contact with the lower surface of a contact connection portion WLb' of the word line WL1i'. The contact plug CL1' comes into contact with a contact connection portion BLe' of the bit line BL0i'. The contact plug CL4' comes into contact with a side portion of the contact connection portion BLe' of the bit line BL1i'. The contact plug CL5' comes into contact with a side portion of a contact connection portion WLe' of the word line WL0i'.

The contact plugs CL7' to CL11' extend in the laminated direction from a layer having the word line WL1i' formed thereon to a layer having the word line WL3i' formed thereon. Each of the contact plugs CL7' to CL10' come into contact with the lower surface of the island-shaped portion WLd' of the word line WL3i'. The contact plug CL11' comes into contact with the lower surface of the contact connection portion WLb' of the word line WL3i'. The contact plug CL8' comes into contact with a side portion of the contact connection portion BLe' of the bit line BL3i'. The contact plug CL9' comes into contact with a side portion of the contact connection portion BLe' of the bit line BL2i'. The contact plug CL10' comes into contact with a side portion of the contact connection portion WLe' of the word line WL2i'.

The contact plug CL12' extends in the laminated direction from a layer having the word line WL3i' formed thereon to an upper wiring M2. The contact plug CL12' comes into contact with a side portion of the contact connection portion BLe' of the bit line BL4i'.

Figure 32:
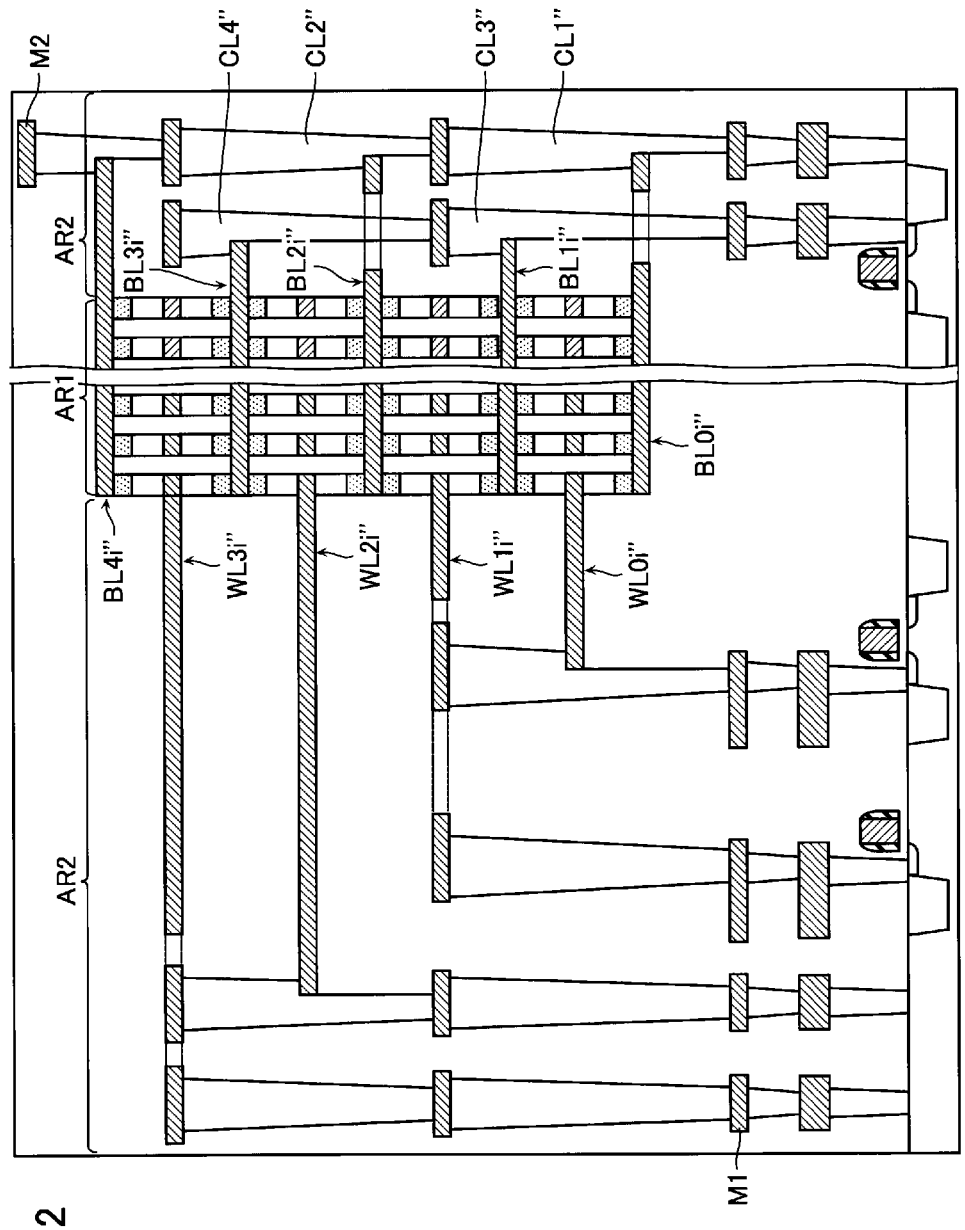
FIG. 32 is a diagram schematically illustrating the connection of contact plugs CL1" to CL4" according to still another embodiment.

For example, in the non-volatile semiconductor memory device according to the invention, the positions of the bit line BL and the word line WL may be reversed. That is, as shown in FIG. 32, the non-volatile semiconductor memory device according to the invention may include a word line WL0i''', a bit line BL0i''', a word line WL1i''', a bit line BL1i''', a word line WL2i''', a bit line BL2i''', a word line WL3i''', a bit line BL3i''', and a word line WL4i''' arranged in this order from the lower side. In this case, the bit line BL0i''', the bit line BL2i''', and the bit line BL4i''' are electrically connected to the contact plugs CL1'' and CL2'' that extend in the laminated direction. The word line WL1i''' and the word line WL3i''' are electrically connected to the contact plugs CL3'' and CL4'' that extend in the laminated direction.

For example, the invention is not particularly limited to the structure of the memory cell, but may be applied to various types of cross-point multi-layer memories, such as a phase-change memory element, an MRAM element, a PFRAM, and an RRAM.

What is claimed is:

1. A non-volatile semiconductor memory device comprising:
    a cell array including a plurality of first wirings, a plurality of second wirings that intersects the plurality of first wirings, and memory cells that are formed at intersections of the first wirings and the second wirings and are connected between the first and second wirings;
    a first contact plug that comes into contact with a side portion of one of the first wirings provided at a first position and extends in a laminated direction to a layer on which one of the second wirings provided at a second position higher than the first position is formed;
    a second contact plug that comes into contact with a side portion of another of the second wirings provided at a third position between the first position and the second position and extends in the laminated direction to the layer;
    a third contact plug that comes into contact with a side portion of another of the first wirings provided at a fourth position between the third position and the second position and extends in the laminated direction to the layer; and
    a fourth contact plug that extends in the laminated direction to the layer, and does not come into contact with a side portion of the first wirings and a side portion of the second wirings,
    wherein a bottom surface of the first contact plug, a bottom surface of the second contact plug, a bottom surface of the third contact plug, and a bottom surface of the fourth contact plug come into contact with each of portions on which yet another of the second wirings provided at a fifth position lower than the first position is formed, respectively.

2. The non-volatile semiconductor memory device according to claim 1, further comprising:
    an upper wiring that is provided above the cell array; and
    a fifth contact plug that comes into contact with a side portion of yet another of the first wirings provided at a sixth position below the upper wiring and extends from yet another of the second wirings provided at a seventh position lower than the sixth position to the upper wiring in the laminated direction.

3. The non-volatile semiconductor memory device according to claim 1, further comprising:
    a lower wiring that is provided below the cell array;
    a sixth contact plug that comes into contact with a side portion of yet another of the first wiring provided at an eighth position above the lower wiring and extends in the laminated direction from the lower wiring to a layer on which yet another of the second wirings provided at a ninth position higher than the eighth position is formed;
    a seventh contact plug that comes into contact with a side portion of yet another of the second wirings provided at a tenth position between the eighth position and the ninth position and extends in the laminated direction to a layer on which yet another of the second wirings provided at the ninth position is formed; and
    an eighth contact plug that comes into contact with a side portion of yet another of the first wirings provided at a eleventh position between the tenth position and the ninth position and extends in the laminated direction to a layer on which yet another of the second wirings provided at the ninth position is formed.

4. The non-volatile semiconductor memory device according to claim 1, wherein the memory cells are provided between the first wirings and the second wirings disposed above and below the first wirings.

5. The non-volatile semiconductor memory device according to claim 1,
    wherein each of the first wirings includes:
    a first straight portion that extends in a straight line in a first direction;
    a first contact connection portion that is formed integrally with the first straight portion; and
    a first island-shaped portion that is provided so as to be separated from the first straight portion and the first contact connection portion, each of the second wirings includes:
a second straight portion that extends in a straight line in a second direction orthogonal to the first direction;
a second contact connection portion that is formed integrally with the second straight portion; and
a second island-shaped portion that is provided so as to be separated from the second straight portion and the second contact connection portion,
the first contact plug comes into contact with a side portion of the first contact connection portion at the first position and comes into contact with a lower surface of the second island-shaped portion at the second position,
the second contact plug comes into contact with a side portion of the second contact connection portion at the third position and comes into contact with the lower surface of the second island-shaped portion at the second position, and
the third contact plug comes into contact with the side portion of the first contact connection portion at the fourth position and comes into contact with the lower surface of the second island-shaped portion at the second position.

6. The non-volatile semiconductor memory device according to claim 5,
wherein the first contact connection portion is provided at one end of a 2n-th (n is a natural number) first straight portion in the second direction on one side of the first straight portion in the first direction, and is provided at the other end of a (2n+1)-th first straight portion in the second direction on the other side of the first straight portion in the first direction.

7. The non-volatile semiconductor memory device according to claim 5, wherein the first contact connection portion is arranged along the second direction at the first position in the first direction.

8. The non-volatile semiconductor memory device according to claim 5,
wherein a (1+4n)-th (n is a natural number) first contact connection portion in the second direction is arranged along the second direction at the second position in the first direction, on one side of the first straight portion in the first direction, and
a (3+4n)-th first contact connection portion in the second direction is arranged along the second direction at the third position in the first direction, on one side of the first straight portion in the first direction.

9. The non-volatile semiconductor memory device according to claim 5, wherein the first contact plug and the second contact plug each have a cylindrical shape or an elliptical cylinder shape.

10. The non-volatile semiconductor memory device according to claim 1,
wherein the first and third contact plugs protrude from the first wirings in a view seen along the laminated direction, and
the second and fourth contact plugs protrude from the second wirings in a view seen along the laminated direction.

11. The non-volatile semiconductor memory device according to claim 1,
wherein a cross-section area of the first and third contact plugs above the first wirings are larger than a cross-section area of the first contact plug below the first wirings, and
a cross-section area of the second and fourth contact plugs above the second wirings are larger than a cross-section area of the second contact plug below the second wirings.

* * * * *

UNITED STATES PATENT AND TRADEMARK OFFICE
CERTIFICATE OF CORRECTION

| | | |
|---|---|---|
| PATENT NO. | : 8,792,278 B2 | Page 1 of 1 |
| APPLICATION NO. | : 13/716310 | |
| DATED | : July 29, 2014 | |
| INVENTOR(S) | : Hiroyuki Nagashima | |

It is certified that error appears in the above-identified patent and that said Letters Patent is hereby corrected as shown below:

On the Title Page, Item (54), and in the Specification, Column 1, the title, after "STORAGE" insert --DEVICE--.

Signed and Sealed this
Twenty-third Day of September, 2014

Michelle K. Lee
*Deputy Director of the United States Patent and Trademark Office*